(12) United States Patent
Ishida et al.

(10) Patent No.: US 6,808,963 B2
(45) Date of Patent: Oct. 26, 2004

(54) PROCESS FOR FABRICATING A THIN-FILM DEVICE HAVING INCLINED SIDES

(75) Inventors: Yukimasa Ishida, Kawasaki (JP); Kenichi Nagaoka, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/761,753

(22) Filed: Jan. 18, 2001

(65) Prior Publication Data

US 2001/0001482 A1 May 24, 2001

Related U.S. Application Data

(62) Division of application No. 09/041,674, filed on Mar. 13, 1998, now Pat. No. 6,198,132.

(30) Foreign Application Priority Data

Mar. 14, 1997 (JP) .............................. 9-060772
Mar. 5, 1998 (JP) .............................. 10-53729

(51) Int. Cl.⁷ .................... H01L 21/00; H01L 21/84
(52) U.S. Cl. .................... 438/149; 438/466; 257/347
(58) Field of Search ................ 438/149–154, 438/466; 257/347–352, 59, 72; 348/46

(56) References Cited

U.S. PATENT DOCUMENTS

| | | | | |
|---|---|---|---|---|
| 5,028,551 A | * | 7/1991 | Dohjo et al. | 437/41 |
| 5,170,244 A | * | 12/1992 | Dohjo et al. | 257/72 |
| 5,202,274 A | * | 4/1993 | Bae et al. | 437/40 |
| 5,238,872 A | * | 8/1993 | Thalapaneni | 438/453 |
| 5,434,104 A | * | 7/1995 | Cain et al. | 438/652 |
| 5,698,869 A | | 12/1997 | Yoshimi et al. | 257/347 |
| 5,728,592 A | | 3/1998 | Oki et al. | 257/59 |
| 5,915,172 A | * | 6/1999 | Noumi et al. | 438/151 |
| 5,942,767 A | * | 8/1999 | Na et al. | 257/59 |
| 5,970,326 A | * | 10/1999 | Lawley et al. | 438/158 |
| 5,990,492 A | * | 11/1999 | Kim | 257/59 |
| 5,990,986 A | * | 11/1999 | Song et al. | 349/43 |
| 6,037,274 A | * | 3/2000 | Kudo et al. | 438/778 |
| 6,071,830 A | * | 6/2000 | Matsuzawa et al. | 438/778 |
| 6,087,648 A | * | 7/2000 | Zhang et al. | 250/208.1 |
| 6,120,640 A | * | 9/2000 | Shih et al. | 156/345.1 |
| 6,133,162 A | * | 10/2000 | Suzuki et al. | 438/780 |
| 6,230,400 B1 | * | 5/2001 | Tzanavaras et al. | 29/840 |
| 6,274,514 B1 | * | 8/2001 | Jang et al. | 438/778 |
| 6,281,147 B1 | * | 8/2001 | Yamazaki et al. | 438/788 |
| 6,331,356 B1 | * | 12/2001 | Angelopoulos et al. | 428/411.1 |
| 6,338,991 B1 | * | 1/2002 | Zhang et al. | 438/162 |
| 6,508,911 B1 | * | 1/2003 | Han et al. | 118/723 I |
| 6,537,925 B2 | * | 3/2003 | Kim et al. | 438/758 |

FOREIGN PATENT DOCUMENTS

JP    3-38622 A    *  2/1991
JP    10-268347 A  * 10/1998

OTHER PUBLICATIONS

Ghandhi, Sorab; VLSI Fabrication Principles Silicon and Gallium Arsenide, Second Ed., Jhon Wiley & Sons, Inc. p. 641.*

Merriam Webster's Collegiate Dictionary 10th Edition, Merrian Webster Inc. p. 254.*

Wolf and Tauber; Silicon Processing for the VLSI Era vol. 1: Process Technology, pp. 332, 452–453; Lattice Press 1986; Sunset Beach, California.*

* cited by examiner

Primary Examiner—George Fourson
Assistant Examiner—Fernando L. Toledo
(74) Attorney, Agent, or Firm—Westerman, Hattori, Daniels & Adrian, LLP

(57) ABSTRACT

In a process for producing a thin-film device, a conducting layer composed of an anodically oxidizable metal is formed on a substrate and is etched to form gate bus lines and gate electrode having upper surfaces parallel to the substrate and inclined side surfaces. The gate bus lines and the gate electrodes are anodically oxidized, so that they include inner conducting portions and outer insulating oxide films covering the inner conducting portions. The outer insulating films prevent the bus lines from short circuiting, and the inclined side surfaces of the bus lines makes it possible to fabricate a dense wiring arrangement.

24 Claims, 14 Drawing Sheets

PROCESS FOR FABRICATING A THIN-FILM DEVICE HAVING INCLINED SIDES

REFERENCES TO RELATED APPLICATION

This application is a division of the application with Ser. No. 09/041,674 filed on Mar. 13, 1998, now U.S. Pat. No. 6,198,132.

BACKGROUND OF THE INVENTION

1. Field of the Invention

The present invention relates to a process for fabricating a thin-film device such as a substrate, including thin-film transistors, of, for example, a liquid crystal panel. The present invention also relates to a thin-film device.

2. Description of the Related Art

In recent years, there have been proposed advanced liquid crystal panels having active matrix drives. A liquid crystal panel includes a liquid crystal filled between a pair of opposing substrates, one substrate being provided with a transparent common electrode and the other substrate being provided with a plurality of small pixel electrodes. The latter substrate includes pixel electrodes as well as gate bus lines, drain bus lines and thin-film transistors.

In producing the substrate including thin-film transistors, gate bus lines, gate electrodes and storage capacitor electrodes are formed on an insulating substrate, the gate bus lines are covered with an insulating layer, a semiconductor layer is formed thereon, and a channel protection film is formed thereon and is covered with an insulating layer. Thereafter, source electrodes, drain electrodes and drain bus lines are formed. Then, an insulating layer is formed thereon, and pixel electrodes are formed thereon. The insulating layer is perforated to connect the pixel electrodes to the source electrodes. In the substrate including thin-film transistors as described above, the gate bus lines, drain bus lines, thin-film transistors, pixel electrodes and the like are formed by laminating conducting layers and insulating layers.

The liquid crystal panel is required to have a high resolution and a high opening degree of apertures. For this purpose, it is requested that the gate bus lines, the gate electrodes and the like electrically connected to the gate bus lines be densely arranged; this in turn requires that the gate bus lines should be formed narrower and have reduced resistance. To maintain the high quality of the display, furthermore, storage capacitor electrodes are formed on the substrate using the same layer as the gate bus lines. A parasitic capacitance appears between a gate electrode and a source electrode which are overlapping. To maintain a high quality of the display the value of such a parasitic capacitance must be decreased. Also, high yields must be ensured while satisfying these requirements.

The liquid crystal panel is used not only as a display for information equipment but also used in a PDA, in a view finder, in a projector and in the like. The liquid crystal panels are relatively small in size, but it has been desired to provide a liquid crystal panel which is lighter in weight and has higher definition. In these liquid crystal panels, it has recently become necessary to employ low-temperature polycrystalline silicon thin-film transistors that can be formed integrally with the driver.

In order to satisfy both the requirements for narrower bus lines and for lower resistance, it has become necessary to decrease the width of the bus lines and to increase the thickness (or height) of the bus lines. When the thickness of the gate bus lines formed on the substrate is increased, however, the drain bus lines are sharply bent at positions where they are superposed on the gate bus lines when the drain bus lines are formed overlapped on the gate bus lines via an insulating layer. Therefore, the height of the drain bus lines changes at positions corresponding to the upper side edges of the gate bus lines and the etching residue remains; so the drain bus lines are apt to be cut or become defective.

In order to prevent the change in the height of the drain bus lines which may especially occur when the thickness of the gate bus lines is increased, or to prevent the etching residue from remaining unremoved, it is desired to incline the side surfaces of the gate bus lines with respect to the substrate, so that the upper side edges of the gate bus lines become smooth and the drain bus lines are gently bent.

When the gate bus lines are formed by isotropic etching which is normary adopted, however, the upper side edges of the gate bus lines do not become smooth. The inventors of the present case have discovered that the inclination of the side surfaces of all gate bus lines can be controlled to within a predetermined range of angle, by optimizing the baking temperature of the mask and the over-etching time. Upon inclining the side surfaces of the gate bus lines, the upper side edges of the gate bus lines become smooth, so the drain bus lines formed thereon are not broken, and dot defects can be eliminated.

In the etching condition by which the side surfaces of the gate bus lines are to be inclined, however, the angle of inclination of the side surfaces of the gate bus lines varies due to reaction gases generated during the etching, deteriorated etching solutions and variation in the temperature along the surface of the mask when baking the mask. The variation of the angle of inclination of the side surfaces of the gate bus lines can usually be tolerated, but some gate bus lines become too narrow or the angle of inclination is too small so that the side surfaces extend, in the shape of a hem of a skirt, along the substrate. The same also occurs for the gate electrodes and the storage capacitor electrodes formed together with the gate bus lines.

If the angle of inclination of the side surfaces of the gate bus lines is too small and the side surfaces are extended like the hems of skirts along the substrate, the areas of the gate bus lines located close to the substrate are increased and come into contact with other neighboring gate bus lines or gate electrodes, giving rise to the occurrence of short-circuiting in the same layer and causing the source electrodes, drain electrodes and gate electrodes to be overlapped on the gate bus lines to an excess degree, resulting in an increase in parasitic capacitances. In addition, when the channel protection film is to be formed by back-surface exposure using the gate, the shape of the channel protection film often becomes abnormal corresponding to the shape of the gate. As a result of investigation, it has been found that etching defects occur at the region where the gate bus lines, and gate electrodes and gate terminal-drawing portions electrically connected to the gate bus lines are densely arranged.

In the liquid crystal display device, furthermore, it is desired that the wiring is formed of, for example, aluminum or a metal material containing aluminum as a chief component in order to decrease the resistance of the bus lines. Such a metal material is layered on the glass substrate by, for example, sputtering and then patterned into a predetermined shape by etching or the like. However, unless the degree of vacuum is sufficiently high in the sputtering chamber prior to forming the films, aluminum or a metal containing aluminum as a chief component is apt to form bumps due to the subsequent thermal hysteresis, resulting in destruction of devices formed on the aluminum bus lines.

Moreover, a polycrystalline silicon thin-film transistor (p-SiTFT) has a mobility about 100 times as great as that of an amorphous silicon thin-film transistor (a-SiTFT), and makes it possible to form peripheral circuits and very small TFTs, which makes it possible to fabricate a liquid crystal panel that could not be achieved with the a-SITFTs. However, the p-SiTFT has a high ON current value and a high OFF current value, permitting a large current leakage. Therefore, dot defects may occur after the panel is fabricated, and the peripheral circuits formed using p-SiTFTs consume large amounts of electric power.

In order to reduce the OFF current value therefore, it has been proposed to form an offset around the gate using an LDD (lightly doped drain) structure. For example, the channel portion in the semiconductor layer is not doped with impurities but the portions on the outer side of the channel portion in the semiconductor layer are doped with impurities to form an HDD (heavily doped drain) to form a source electrode and a drain electrode. Here, small regions between the channel portions and source electrode/drain electrodes are doped with impurities to a smaller degree than in the portions of the source electrode and the drain electrode, to thereby form the LDD, i.e., to form an offset.

Japanese Unexamined Patent Publication (Kokai) No. 7-235680 discloses a method for fabricating a thin-film transistor in which an offset is formed. This method includes the steps of forming a semiconductor layer on an insulating substrate, forming a gate electrode having a broad bottom surface (having inclined side surfaces) on the semiconductor layer, doping the semiconductor layer with impurities using the gate electrode as a mask, and etching the inclined side surfaces. A thick portion of the gate electrode does not permit impurities to pass therethrough but the inclined side surfaces of the gate electrode permit impurities to pass therethrough a little. Therefore, the portions covered by the inclined side surfaces of the gate electrode in the semiconductor layer form the LDD, i.e., the offset. According to this prior art, however, the gate electrode must be formed of a material that permits impurities to pass therethrough. According to the production method of this prior art, therefore, limitation is imposed on the materials that can be used as the gate electrodes; i.e., it is not allowed to use aluminum or the like metal which is most adapted to form gate electrodes and gate bus lines. Besides, impurities may pass through the thick portion of the gate electrode, deteriorating the performance of the channel.

SUMMARY OF THE INVENTION

The object of the present invention is to solve the above-mentioned problems and to provide a process for fabricating a thin-film device having a plurality of bus lines of a smooth shape and connection portions electrically connected to the bus lines and a thin-film device fabricated by such a process.

Another object of the present invention is to provide a process for fabricating a thin-film device, by which the formation of bumps on the surfaces of the bus lines can be prevented and the devices formed on the bus lines can be prevented from being destroyed.

A further object of the present invention is to provide a process for fabricating a thin-film device, which is capable of suitably forming an LDD structure, and to provide a thin-film device fabricated thereby.

A process for fabricating a thin-film device according to the present invention comprises the steps of forming a conducting layer that can be anodically oxidized on a substrate; etching said conducting layer to form a plurality of bus lines having upper surfaces parallel to said substrate and inclined side surfaces and connection portions electrically connected to said bus lines and having upper surfaces parallel to said substrate and inclined side surfaces; and anodically oxidizing said bus lines and said connection portions, so that said bus lines and said connection portions include inner conducting portions and outer insulating oxide films covering said inner conducting portions, respectively.

In this process, the bus lines are gate bus lines formed in the substrate of a liquid crystal panel, for example, and the connection portions electrically connected thereto are gate electrodes. These bus lines and connection portions have upper surfaces parallel to the substrate and inclined side surfaces. This makes it possible to satisfy both requirements of reducing the width of the bus lines and increasing the thickness of the bus lines.

When such bus lines and connection portions are formed by etching, the inclination of the side surfaces of the bus lines and of the connection portions may vary and a portion of some bus lines and connection portions located close to the substrate is extended in the shape of a hem of a skirt along the substrate so that the area of the portion close to the substrate may become greater than a predetermined area. Due to the anodic oxidation, however, the upper portions of the bus lines and of the connection portions turn into outer insulating oxide films. Therefore, even when the bus line and the connection portion are extended like a skirt by etching, the skirt portion is the outer oxide film, and no short-circuiting takes place between the gate bus lines and the neighboring conductors.

Preferably, the etching step is carried out so that the side surfaces of said bus lines and the side surfaces of said connection portions are inclined at angles within the range from 20 degrees to 60 degrees, on average, with respect to said substrate. More preferably, the etching step is carried out so that the side surfaces of said bus lines and the side surfaces of said connection portions are inclined at angles within the range from 30 degrees to 50 degrees, on average, with respect to said substrate.

Preferably, the process further comprises the step for forming a mask on said conducting layer prior to said etching step, and the step for ashing said substrate including said mask between said mask-forming step and said etching step. The process further comprises a step for forming a mask on said conducting layer and a step for baking said mask prior to said etching step, wherein the temperature for baking said mask in said baking step is so set that said mask will have a relatively small rigidity so that an outer portion of said mask is pushed away from said conducting layer due to a reaction gas in said etching step. In this case, the temperature for baking said mask in said baking step is not higher than 115° C.

Moreover, the etching step is carried out so that the side surfaces of said bus lines and the side surfaces of said connection portions are outwardly convex. Furthermore, the etching step is carried out so that the angles between the upper surfaces and the side surfaces of said bus lines and of said connection portions are obtuse angles.

The process further comprises an ionic milling step for removing part of the outer oxide films to expose the inner conducting portions after said step of anodic oxidation.

Moreover, a thin-film device according to the invention comprises at least a substrate, a plurality of bus lines provided on said substrate, and connection portions electrically connected to said bus lines, said bus lines and said connection portions being formed of an anodically oxidizable metal and having upper surfaces parallel to said substrate and inclined side surfaces, respectively, said bus lines and said connection portions including inner conducting portions and outer insulating oxide portions formed by anodic oxidation to cover said inner conducting portions, respectively.

The thin-film device has the same actions and effects as those of the above-mentioned device.

Preferably, said thin-film device is a substrate including thin-film transistors. In this case, the substrate including said thin-film transistors is a substrate of a liquid crystal display device, said bus lines are gate bus lines, and said connection portions are gate electrodes of said thin-film transistors, said thin-film device further comprising an insulating layer covering said bus lines and said connection portions, a plurality of drain bus lines arranged on said insulating layer to cross said gate bus lines, and a plurality of pixel electrodes. The device further comprises storage capacitor electrodes arranged on said substrate and made of the same material as said gate bus lines and said connection portions. Or, said thin-film device is an MIM diode.

Preferably, said anodically oxidizable metal comprises at least the one selected from the group consisting of Al, Ta, Al—Si, Al—Ta, Al—Zr, Al—Nd, Al—Pd, Al—W, Al—Ti, Al—Ti—B, Al—Sc, Al—Y, Al—Pt, and Al—Pa.

Preferably, the side surfaces of said bus lines and the side surfaces of said connection portions are inclined at angles within the range from 20 degrees to 60 degrees, on average, with respect to said substrate. More preferably, side surfaces of said bus lines and the side surfaces of said connection portions are inclined at angles within the range from 30 degrees to 50 degrees, on average, with respect to said substrate.

Preferably, the side surfaces of said bus lines and the side surfaces of said connection portions are outwardly convex. Furthermore, the angles between the upper surfaces and the side surfaces of said bus lines and of said connection portions are obtuse angles.

Besides, at least two outer oxide films of said plurality of bus lines and said connection portions contact each other and said contacting outer oxide films electrically isolate the inner conducting portions covered by said contacting outer oxide films.

A conducting portion separate from said bus lines and said connecting portions is arranged close to said bus lines or said connecting portions, said separate conducting portion includes an inner conducting portion and an outer insulating oxide portion covering said inner conducting portion, the outer oxide film of said separate conducting portion contacts at least one outer oxide film of said bus lines and of said connection portions, and said contacting outer oxide films electrically isolate the inner conducting portions that are covered by said contacting outer oxide films.

According to another feature of the present invention, a process for fabricating a thin-film device comprises: forming a conducting layer composed of an anodically oxidizable metal on a substrate; etching said conducting layer in a predetermined shape; forming a second oxide film on said conducting layer by anodic oxidation after a first oxide film with a predetermined thickness is formed on said conducting layer; and washing said substrate, whereby said first oxide film is removed by said washing, and said second oxide film is not removed by said washing but remains on said conducting layer so as to cover said conducting layer.

According to this process for production, the conducting layer composed of an anodically oxidizable metal forms gate electrodes and gate bus lines. The first oxide film and the second oxide film being laminated thereon are formed on the conducting layer. The second oxide film is formed under the first oxide film by anodically oxidizing the metal that forms the conducting layer. The first oxide film is located on the surface of the second oxide film. The first oxide film is a crystalline oxide film affected by the anodic oxidation and can be easily removed upon washing the substrate. The second oxide film is not removed by washing but remains on the conducting layer so as to cover the conducting layer. Since the first oxide film can be removed by washing, particles that adhere to the surface of the conducting layer can be removed together with the first oxide film. Accordingly, no bumps form on the surfaces of the bus lines, and devices formed on the bus lines are prevented from being destroyed. The second oxide film is not removed but remains, and is effective in reducing the width of the bus lines and in increasing the thickness of the bus lines as in the anodically oxidized film of the first invention.

In this case too, the anodically oxidizable metal includes at least one of Al, Ta, Al—Si, Al—Ta, Al—Zr, Al—Nd, Al—Pd, Al—W, Al—Ti, Al—Ti—B, Al—Sc, Al—Y, Al—Pt, and Al—Pa.

Preferably, the first oxide film is one of a naturally oxidized film or a hydrated film formed on the surface of said anodically oxidizable metal. Preferably, the first oxide film has a thickness from 50 nm to 100 nm. Preferably, the washing step is executed using ultrasonic waves of not lower than 200 KHz.

Preferably, the thin-film device is a substrate including thin-film transistors. In this case, the process further comprises a step for forming an insulating film on said substrate and a step for forming a semiconductor layer on said substrate after the second oxide film has been formed, wherein the step for etching said conducting layer forms gate electrodes and gate wirings. Or, the process further comprises a step for forming a semiconductor layer on said substrate and a step for forming an insulating film on said substrate prior to forming said conducting layer, wherein the step for etching said conducting layer forms gate electrodes and gate wirings.

Preferably, the step for etching said conducting layer forms a gate electrode having an upper surface parallel to said substrate and a tilted side surface.

According to a still further feature of the present invention, a process for fabricating a thin-film device comprises the steps of forming a semiconductor layer having a predetermined shape on a substrate; forming an insulating film on said substrate to cover said semiconductor layer; forming a conducting layer composed of an anodically oxidizable metal on said substrate in such a shape as to cover a portion of said semiconductor layer and to form gate electrodes having upper surfaces parallel to said substrate and inclined side surfaces; anodically oxidizing said gate electrodes; forming said insulating film into a predetermined shape using said gate electrode including the anodically oxidized film as a mask; and injecting impurities into said semiconductor layer using said gate electrodes including said anodically oxidized film and said insulating film as a mask to form an offset in said semiconductor layer.

This feature makes it possible to produce a substrate including polycrystalline silicon thin-film transistors having an offset formed by the LDD structure.

Moreover, the present invention provides a thin-film device comprising a substrate, a semiconductor layer formed in a predetermined shape on said substrate, an insulating film covering a portion of said semiconductor layer, a gate electrode formed on said insulating film, and an anodically oxidized film of said gate electrode formed on said insulating film so as to cover said gate electrode, said anodically oxidized film having a shape as viewed from above which is identical to the shape of said insulating film as viewed from above and having an annular portion in innular contact with said insulating film about said gate electrode, a portion of said semiconductor layer located on the outer side of said insulating film forming a source electrode and a drain electrode, and a portion of said semiconductor layer covered by said annular portion of said anodically oxidized film forming an offset on the inner side of said insulating film.

Moreover, the present invention provides a liquid crystal display device comprising a first substrate comprising the above-described thin-film device having a plurality of thin-film transistors, a second substrate opposed to the first substrate, and a liquid crystal layer filled between the first and second substrates.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

FIGS. 1 to 6 are views illustrating a process for producing a thin-film device according to the present invention.

Figure 1:
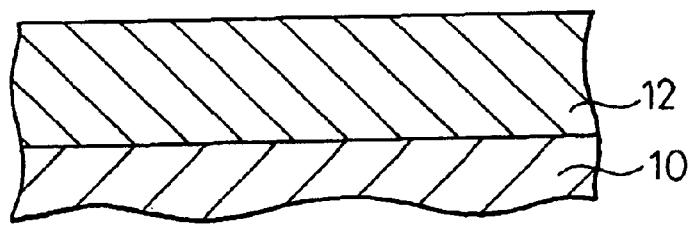
FIG. 1 is a cross-sectional view illustrating the step for forming a conducting layer on a substrate in a process for fabricating a thin-film device according to the first embodiment of the present invention.

In FIG. 1, an anodically oxidizable conducting layer 12 is formed on a glass substrate 10. It is desired that the anodically oxidizable conducting layer 12 is made of aluminum or an aluminum alloy. In this embodiment, a layer of Al-Sc having a thickness of 400 nm is formed on the glass substrate 10 by sputtering. As an anodically oxidizable metal, it is possible to use Al, Ta, Al—Si, Al—Ta, Al—Zr, Al—Nd, Al—Pd, Al—W, Al—Ti, Al—Ti—B, Al—Sc, Al—Y, Al—Pt, Al—Pa.

Figure 2:
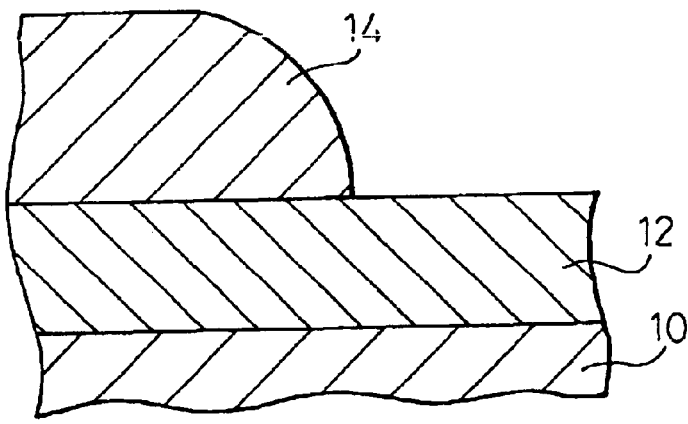
FIG. 2 is a cross-sectional view illustrating the step for forming a mask.

Referring to FIG. 2, a mask 14 of a photoresist is formed on the conducting layer 12. In this case, the photoresist is formed by applying LC-200, manufactured by Shibray Far East Co., to a thickness of 1.5 μm, and prebaking is carried out at 110° C. for 100 seconds. After prebaking, the photoresist is exposed to light of 2000 mJ through a predetermined pattern and is developed to obtain a mask 14 of a predetermined pattern. Thereafter, post-baking is effected at 80° C. for 90 seconds (post-baking may be omitted).

Figure 3:
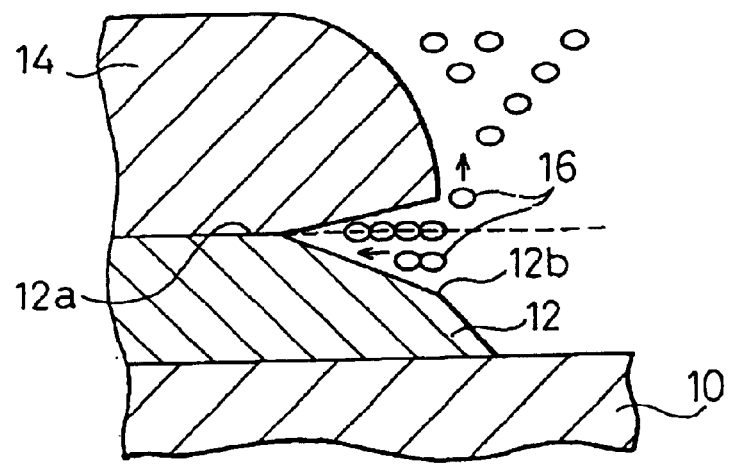
FIG. 3 is a cross-sectional view illustrating the etching step.

Referring next to FIG. 3, the conducting layer 12 is etched. In this embodiment, however, the substrate 10 having the mask 14 formed thereon is subjected to ashing, prior to the etching. The ashing is conducted by RIE under the conditions of a pressure of 30 Pa, RF power of 500 watts and an oxygen flow rate of 400 SCCM, for 30 seconds. Upon ashing, the surface of the mask 14 exhibits enhanced wettability to an etching solution, so that the reaction gas does not adhere on the bus lines that neighbor each other at small distances, and the occurrence of defective etching is prevented.

In FIG. 3, the etching is carried out using an etching solution containing $H_3PO_4$, $HNO_3$, $CH_3COOH$, or $H_2O$. Preferably, $HNO_3$ is contained in an amount of not less than 5% by weight. The just-etching time for etching the conducting layer 12 using the above-mentioned etching solution is about 65 seconds. According to this embodiment, however, the etching is carried out for 100 seconds with the dip-swinging system. Therefore, the over-etching is about 55%.

Reaction gas 16 such as $N_2$ and $H_2$ gases is generated during the etching. The reaction gases 16 partly rise as bubbles in the etching solution but partly stay as bubbles under the mask 14. The reaction gases 16 staying under the mask 14 push up the outer side portion of the mask 14 from the conducting layer 12. Therefore, a gap is formed between the outer side portion of the mask 14 and the conducting layer 12, so the etching solution readily flows to the surface 12a of the conducting layer 12 under the mask 14, and the side surface 12b of the conducting layer 12 is inclined by a certain angle with respect to the substrate 10. Besides, the side surface 12b of the conducting layer 12 is outwardly convex. An angle between the upper surface 18a of a bus line 18 and the side surface 18b (FIG. 4) becomes an obtuse angle, and the boundary between the surface 12a and the side surface 12b of the conducting layer 12 becomes smooth.

Figure 4:
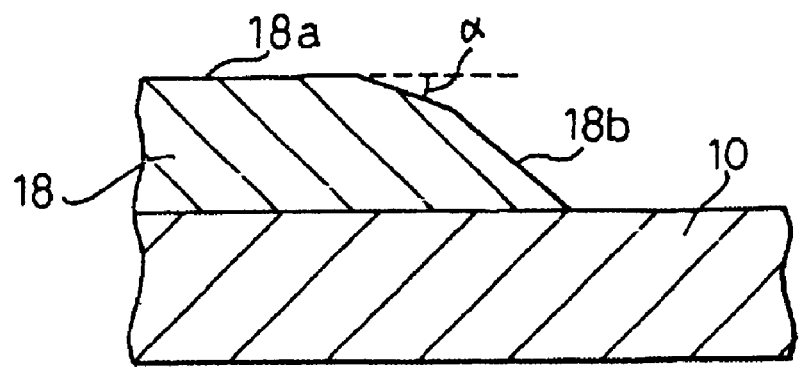
FIG. 4 is a cross-sectional view illustrating the step for removing the mask.
Figure 5:
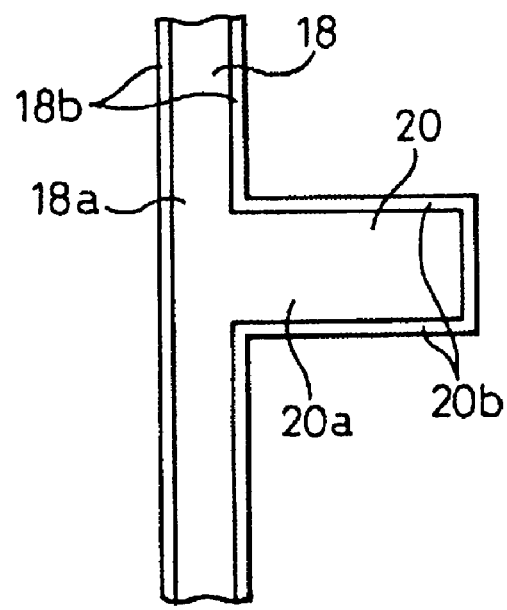
FIG. 5 is a plan view illustrating the bus line and the connection portion.

Next, when the mask 14 is removed, a bus line 18 having an upper surface 18a parallel to the substrate 10 and an inclined side surface 18b (inclination angle α), and a connection portion 20 electrically connected to the bus line 18 and having an upper surface 20a parallel to the substrate 10 and an inclined side surface 20b are formed, as shown in FIGS. 4 and 5. FIGS. 3 and 4 illustrate the bus line 18 only, within the conducting layer 12.

In order that the outer side portion of the mask 14 is pushed up by the reaction gas 16 from the conducting layer 12, it is desired that the mask 14 has a relatively small rigidity. According to the present invention, an optimum baking temperature is employed so that the outer side portion of the mask 14 is pushed up by the reaction gas 16 from the conducting layer 12, by utilizing the fact that the rigidity of the mask 14 increases with an increase in the baking temperature and the rigidity of the mask 14 decreases with a decrease in the baking temperature. It is therefore desired that the baking temperature is not higher than 115° C.

Figure 7:
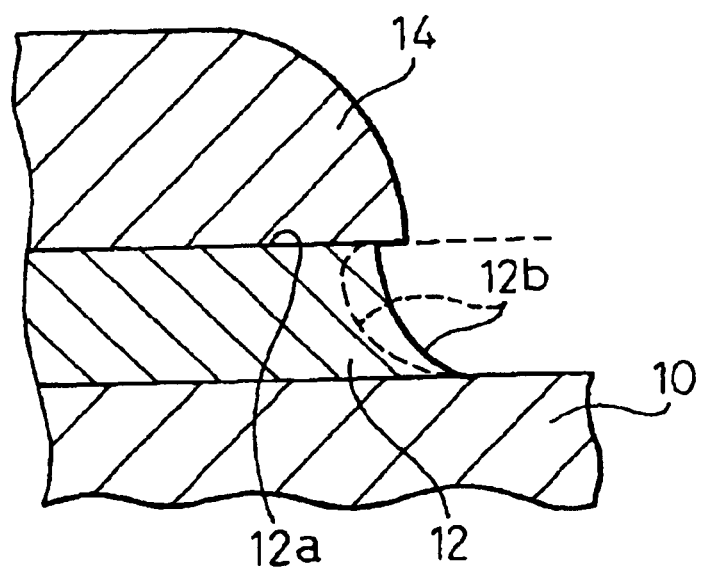
FIG. 7 is a cross-sectional view illustrating the isotropic etching.

FIG. 7 illustrates a comparative example in which a general isotropic etching is effected. The mask 14 is baked at a temperature of usually from 120° C. to 140° C. Therefore, the mask 14 exhibits a relatively high rigidity, and the outer side portion of the mask 14 is not pushed up by the reaction gases from the conducting layer 12. Though the conducting layer 12 is over-etched, the side surface 12b neighboring the upper surface 12a of the conducting layer 12 is not substantially inclined. The side surface 12b assumes an outwardly concave shape. As the amount of over-etching increases, the wall between the upper surface 12a and the side surface 12b becomes an edge, as indicated by a broken line 12b.

Figure 6:
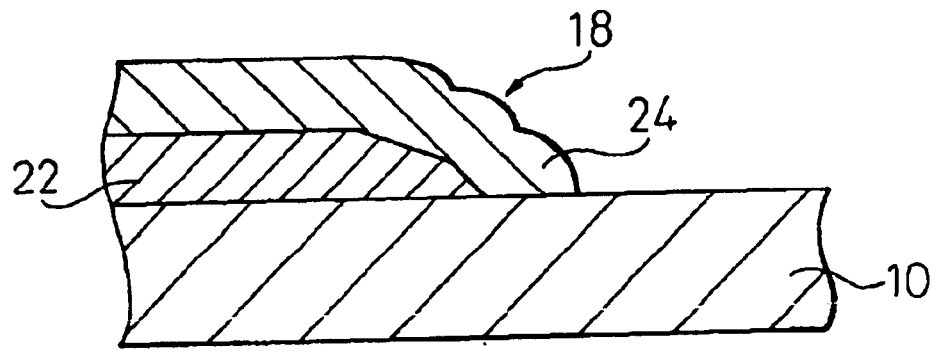
FIG. 6 is a cross-sectional view illustrating the step for anodic oxidation.

After the steps shown in FIGS. 4 and 5, the bus line 18 and the connection portion 20 are anodically oxidized, as shown in FIG. 6. Since only the outer portions of the bus line 18 and of the connection portion 20 are anodically oxidized, the bus line 18 and the connection portion 20 include inner conducting portions 22 and outer insulating oxide films 24 covering the inner conducting portions 22, respectively. The outer oxide film 24 is chiefly composed of alumina and forms a transparent insulating layer. As an anodically oxidizing solution, an aqueous solution containing ethylene glycol and ammonium tartrate can be used.

Figure 8:
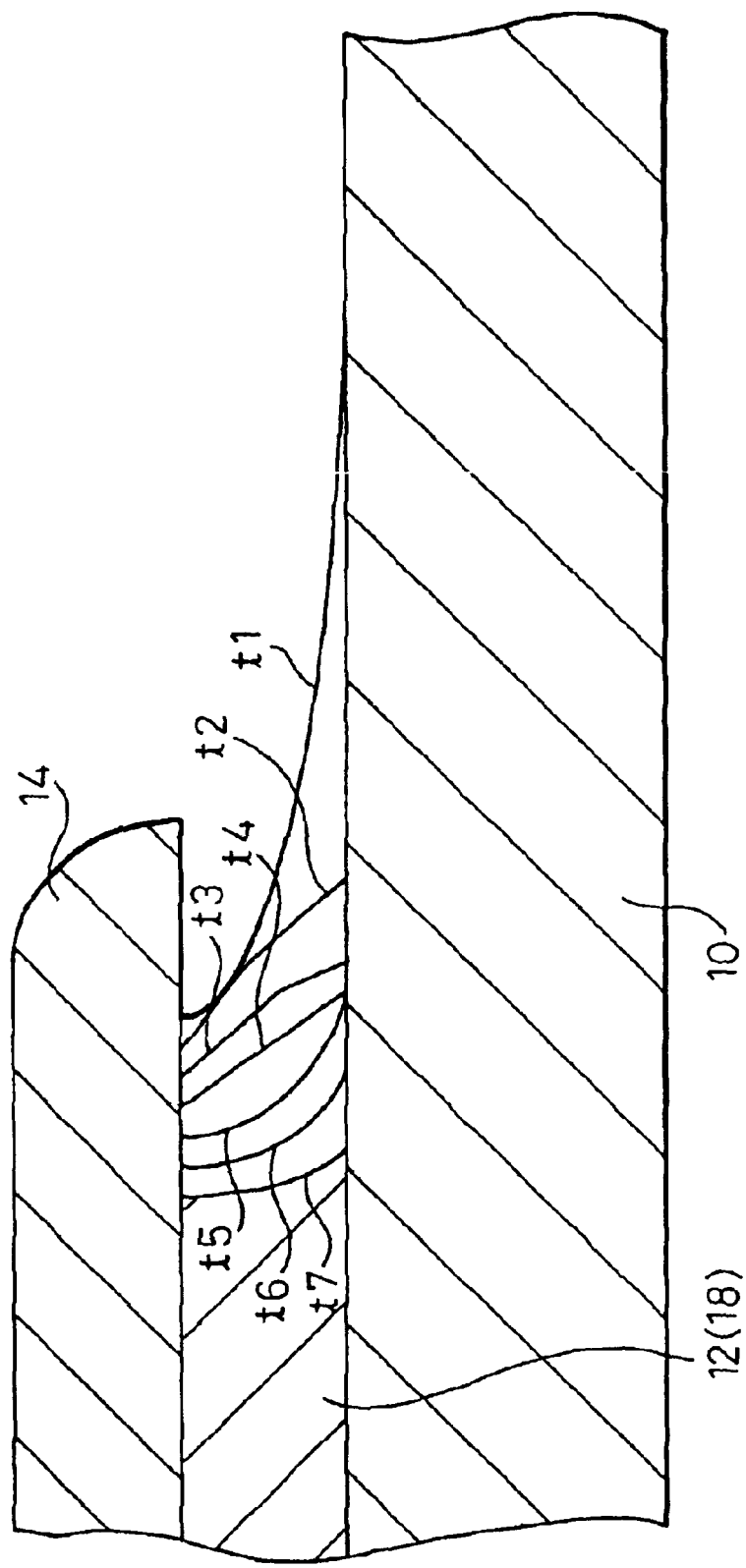
FIG. 8 is a cross-sectional view illustrating the relationship between the etching time and the inclination of the side surface of the bus line which is etched.

FIG. 8 illustrates the shapes of the side surfaces t1 to t7 of the bus line 18 when the etching is executed for various etching times. The shapes of the side surfaces t1 to t7 correspond to the etching times, and a smaller subscript indicates a shorter time. The shapes of the side surfaces t2 and t3 of the bus line 18 are outwardly convex similar to the preferred shapes shown in FIGS. 3 and 4. Referring to the shape of the side surface t1 of the bus line 18, the etching residue is remaining on the substrate since the etching time is short, and is extended in the form of a hem of a skirt along the substrate 10. The shape of the side surface on which the etching residue is remaining in large amounts is not desirable since it may make a short-circuit with another conductor during use. If the etching time is too long, the shape of the side surfaces t6 to t7 of the bus line 18 gradually approach the vertical.

Therefore, the etching times corresponding to the shapes of the side surfaces t2 and t3 of the bus line 18 are selected as a matter of course, whereby it is possible to ensure that the side surface 18b of the bus line 18 and the side surface 20b of the connection portion 20 are inclined at any desired angles within the range from 30 degrees to 50 degrees, on average, with respect to the substrate 10. Even under slightly adverse conditions, the side surface 18b of the bus line 18 and the side surface 20b of the connection portion 20 are inclined at angles within the range from 20 degrees to 60 degrees, on average, with respect to the substrate 10. Though only one bus line 18 is shown in FIGS. 3 to 5 and in FIG. 8, a plurality of bus lines 18 and connection portions 20 are formed on the substrate 10, and an average value stands for an average inclined angle of the side surfaces of the plurality of bus lines 18.

Even in the case where the etching is carried out for a period of time that is selected so that the inclined angles of the side surfaces 18b of the bus lines 18 and of the side surfaces 20b of the connection portions 20 will lie within the range from 30 degrees to 50 degrees in average, the inclining angles of the side surfaces 18b of a part of the bus lines 18 and the inclining angles of the side surfaces 20b of a part of the connection portions 20 may become close to the shape of the side surface t1 of the bus lines 18, due to an uneven etching or uneven thickness. In such a case, the shape of the side surface t1 of the bus line 18 is shaped like a flared skirt along the substrate 10, and may make a short-circuit with another conductor if the bus lines 18 are used in this state.

Therefore, the anodic oxidation is effected so that even when the side surfaces 18b of the bus lines 18 and the side surfaces 20b of the connection portions 20 are etched into the shape like the flared skirt, the skirt portion turn into the anodically oxidized insulating films 24, as shown in FIG. 6, so the skirt portion will not make a short-circuit with another conductor during use.

Figure 9:
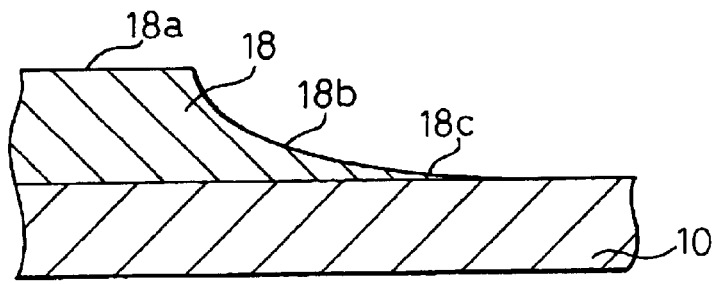
FIG. 9 is a cross-sectional view illustrating an example where the etched side surface of the bus line is extended in the form of a hem of a skirt.
Figure 10:
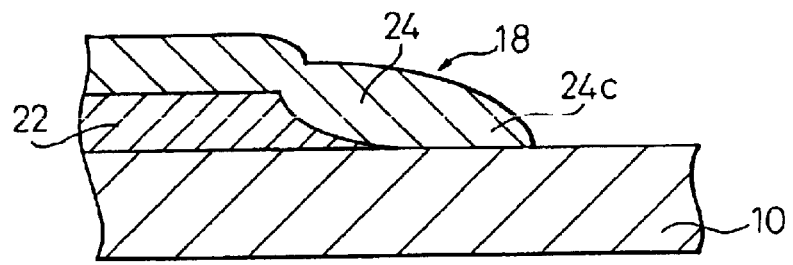
FIG. 10 is a cross-sectional view of the bus line of FIG. 9 which is anodically oxidized.

FIGS. 9 and 10 illustrate the above-mentioned case. In FIG. 9, the side surface 18b of the bus line 18 is formed like a skirt extending along the substrate 10 by etching and has a lower edge portion 18c near the substrate 10. In FIG. 10, the bus line 18 is anodically oxidized to include the inner conducting portion 22 and the outer oxidized insulating film 24 covering the inner conducting portion 22. The size of the inner conducting portion 22 along the surface of the substrate 10 is reduced. Therefore, despite the side surfaces 18b of the bus lines 18 and the side surfaces 20b of the connection portions 20 are etched into a shape having a skirt, no short-circuit is made with another conductor during use.

Figure 11:
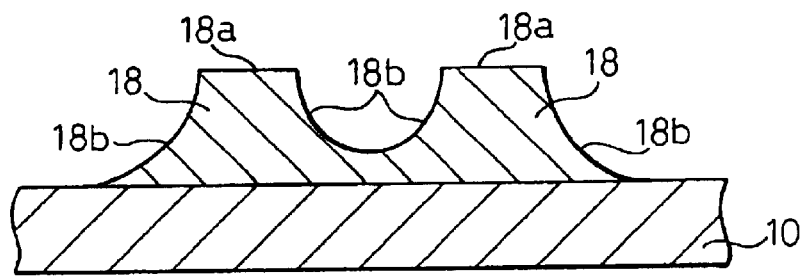
FIG. 11 is a cross-sectional view illustrating an example in which two bus lines are arranged close to each other.

Referring to FIG. 11, furthermore, if the shape having a skirt extending along the substrate 10 of the side surfaces 18b of the bus lines 18 (or their connecting portions at the ends of the bus lines 18) appears between two neighboring bus lines 18 (or terminal connecting portions at the ends of the bus lines 18), two neighboring bus lines 18 are joined to each other. This also occurs at other portions which are connected to the bus lines 18.

Figure 12:
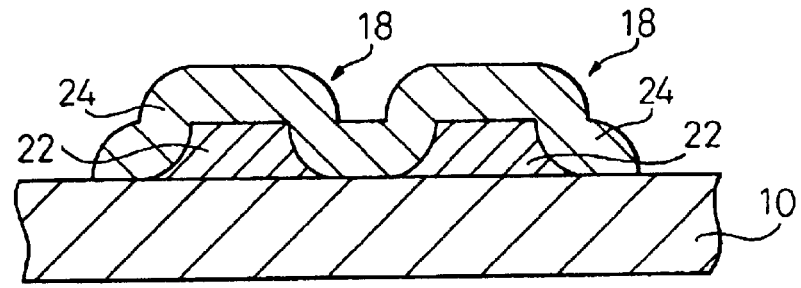
FIG. 12 is a cross-sectional view illustrating the bus lines of FIG. 11 which are anodically oxidized.

Even in this case, as shown in FIG. 12, if the anodic oxidation is carried out, the outer oxide films 24 of two neighboring bus lines 18 contact each other, and electrically isolate the inner conducting portions 22 covered thereby from each other. Therefore, two neighboring bus lines 18, which contact each other at the time of etching, are electrically isolated from each other due to the anodic oxidation. That is, the bus lines are automatically repaired.

It will be obvious that this holds not only for two neighboring bus lines 18 but also for at least one of the bus line 18 and the connection portion 20 and a different conducting portion (made of the same conducting layer 12) arranged close to the bus line 18 or the connecting portion 20. That is, a conductor different from the bus line 18 or the connecting portion 20 is arranged close to the bus line 18 or the connection portion 20, this different conducting portion includes the inner conducting portion 22 and the outer insulating oxide portion 24 covering the inner conducting portion 22, the outer oxide film 24 of this different conducting portion contacts at least the outer oxide film 24 of the bus line 18 or the connection portion 20, and the thus contacting outer oxide films 24 electrically isolate the inner conducting portions 22 covered thereby from each other.

FIGS. 13 to 19 illustrate an example where the present invention is applied to a substrate including thin-film transistors of a liquid crystal panel.

Figure 13:
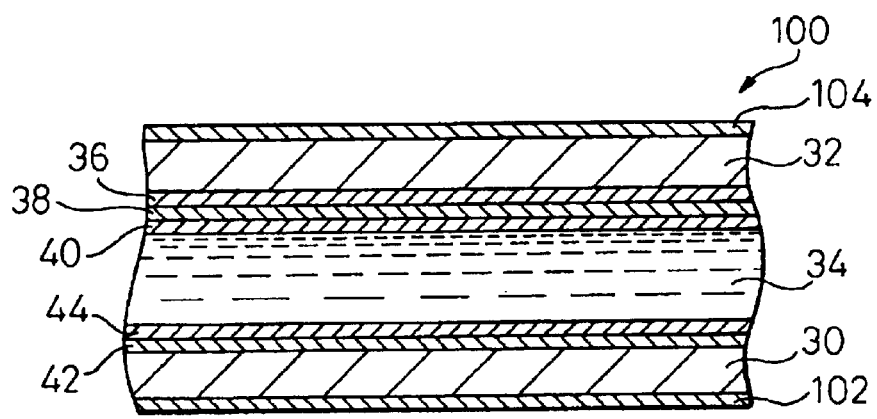
FIG. 13 is a cross-sectional view showing a liquid crystal panel.
Figure 14:
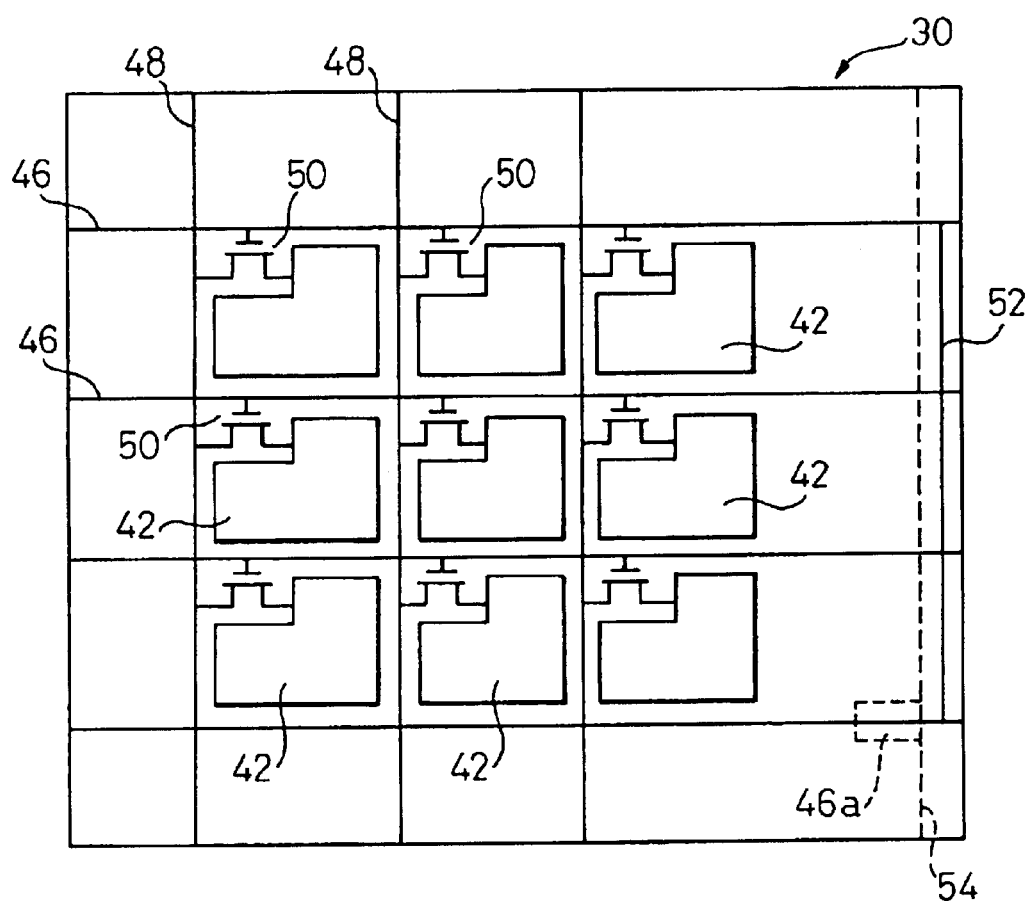
FIG. 14 is a plan view showing a substrate including thin-film transistors of FIG. 13.

Referring to FIGS. 13 and 14, a liquid crystal panel 100 includes a liquid crystal 34 filled between a pair of opposing glass substrates 30 and 32. A polarizer 102 and an analyzer 104 are disposed on either side of the liquid crystal panel 100. A color filter 36, a transparent common electrode 38 and an orientation film 40 are provided on one substrate 32. A plurality of small pixel electrodes 42 and an orientation film 44 are provided on the other substrate 30. The substrate 30 includes pixel electrodes 42 as well as gate bus lines 46, drain bus lines 48, and thin-film transistors 50.

The gate bus lines 46 are all connected by, for example, a conducting line 52 at the peripheral region of the substrate 30, whereby the anodic oxidation is to be executed, all gate bus lines 46 can be simultaneously connected to a power source for anodic oxidation. After the thin film formation process is completed, the substrate 30 is cut at its peripheral portion, for example, at a position designated at 54, and the gate bus lines 46 are separated into individual lines. Also, terminal connecting members portion (e.g., 46a) are provided at the peripheral region of the substrate 30 for connecting the gate bus lines 46 and the drain bus lines 48 to a driving circuit. Since the gate bus lines 46 and the drain bus lines 48 have been covered with an insulating layer in the thin film formation process, it is necessary to remove the insulating layer to reveal the terminal connecting members. As for the gate bus lines 46, furthermore, the anodically oxidized film 24 must be partly removed.

Figure 15:
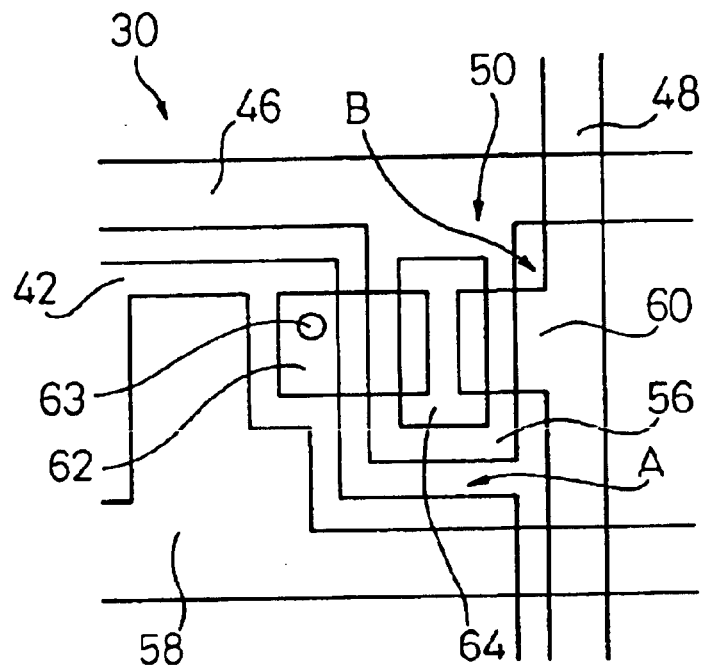
FIG. 15 is an enlarged view illustrating a portion of the thin-film transistor of FIG. 14.

FIG. 15 is a plan view illustrating a portion of a thin-film transistor 50 in the substrate 30. The gate bus line 46 corresponds to the bus line 18 of FIGS. 1 to 6, and a gate electrode 56 of the thin-film transistor 50 corresponds to the connection portion 20 of FIGS. 1 to 6. Furthermore, when the gate terminal connecting member 46a is wider than the gate bus line 46, the gate terminal connecting member also corresponds to the connection portion 20 of FIGS. 1 to 6. A storage capacitor electrode 58 is formed of the same conducting layer as the gate bus line 46. However, the storage capacitor electrode 58 is not electrically connected to the gate bus line 46.

Figure 16:
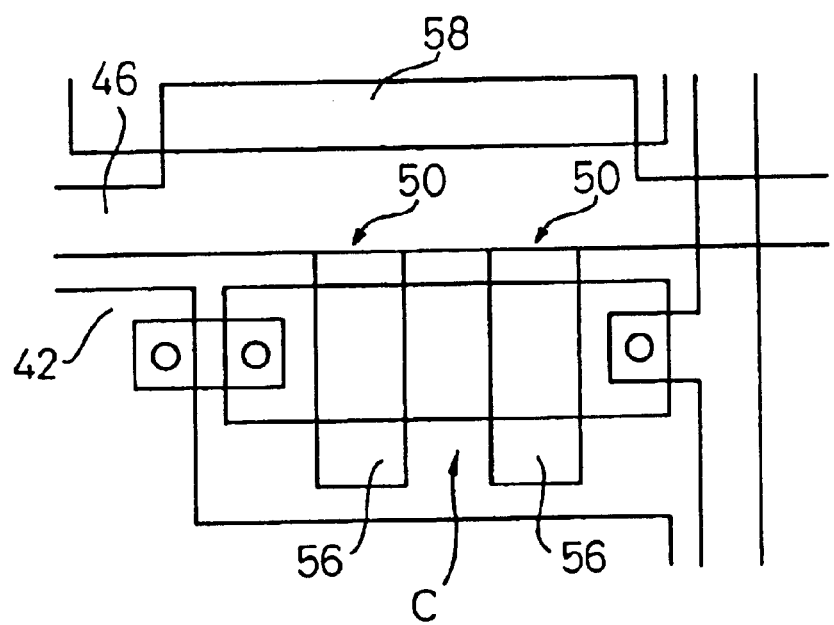
FIG. 16 is a view illustrating a modified example of the portion of the thin-film transistor of FIG. 15.

On the other hand, the storage capacitor electrode 58 of FIG. 16 is electrically connected to the gate bus line 46. FIG. 16 is a view illustrating an example where two thin-film transistors 50 are arranged in series. In other respects, FIG. 16 is similar to FIG. 15.

In FIG. 15, the thin-film transistor 50 further includes a drain electrode 60 and a source electrode 62, the drain electrode 60 being connected to the drain bus line 48, the source electrode 62 being connected to the pixel electrode 42 through a contact hole 63. The drain electrode 60 and the source electrode 62 are formed simultaneously with the drain bus line 48. There are further formed a channel protection film 64 and a semiconductor film.

In FIG. 15, the gate electrode 56 and the storage capacitor electrode 58 are arranged close to each other at a position indicated by, for example, A. At such a position, there is a possibility that the gate electrode 56 and the storage capacitor electrode 58 may come into contact with each other, as shown in FIG. 11, when they are etched. At a position indicated by, for example, B, furthermore, if the gate electrode 56 has a skirt as shown in FIG. 9 and thus an increased area when it is etched, a parasitic capacitance between the gate electrode 56 and the source electrode 62 increases because the source electrode 62 lies above the gate electrode 56. At a position indicated by C in FIG. 16, furthermore, the gate electrodes 56 are arranged close to each other, and there is a possibility that they may come into contact with each other, as shown in FIG. 11, when the gate electrodes 56 are etched.

Figure 17A:
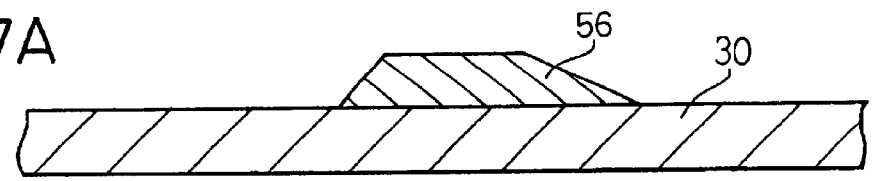
FIGS. 17A to 17E are views illustrating the steps for fabricating the substrate including thin-film transistors of FIG. 14.
Figure 17B:
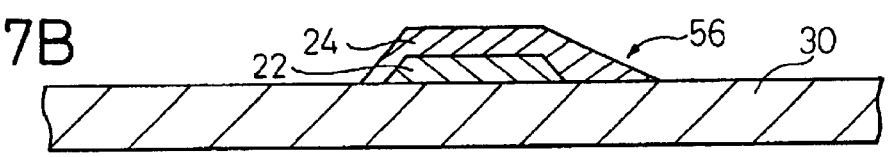

FIGS. 17A to 17E are views illustrating the fabrication of the substrate 30 including the thin-film transistors 50. In FIG. 17A, the gate bus lines 46, the gate electrodes 56, the conducting wires 52 and the storage capacitor electrodes 58 are formed by etching on the glass substrate 30. In FIG. 17B, the gate bus lines 46, the gate electrodes 56, the conducting wires 52 and the storage capacitor electrodes 58 are anodically oxidized. When the storage capacitor electrodes 58 are not electrically connected to the gate bus lines 46, the storage capacitor electrodes 58 are not anodically oxidized. The gate electrodes 56 include the inner conducting portions 22 and the outer transparent and insulating oxide films 24.

Figure 17C:
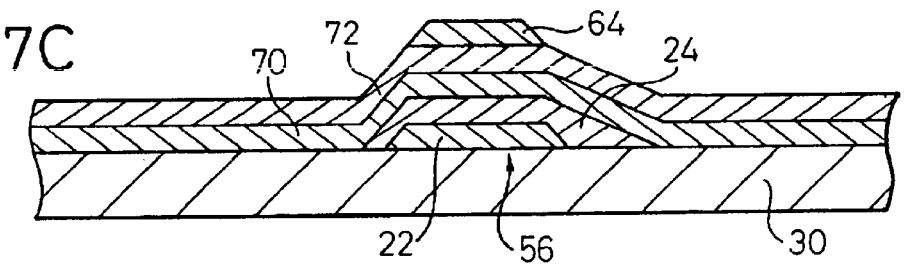
Figure 17D:
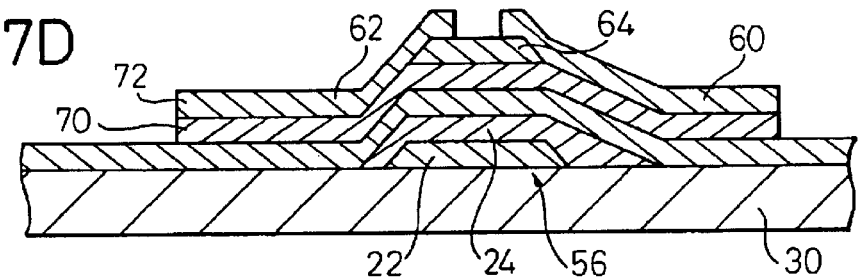
Figure 17E:
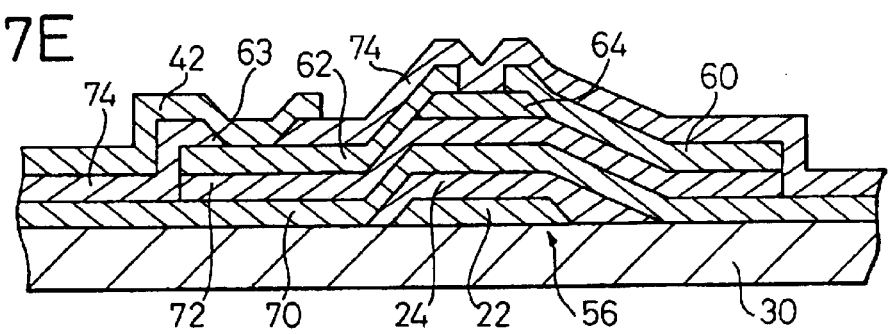

In FIG. 17C, an insulating layer 70, a semiconductor film 72, and a layer serving as a channel protection film 64 are formed. The semiconductor film 72 is composed of an amorphous silicon or polycrystalline silicon. The substrate 30 is then exposed to light from the back surface thereof, and the layer serving as the channel protection film 64 is etched to form the channel protection film 64 having a shape corresponding to the inner conducting portion 22 of the gate electrode 56.

Then, a conducting layer for forming the drain bus lines 48, the drain electrodes 60 and the source electrodes 62 is formed by an n+a-Si film/metal film, in order to form the drain bus lines 48, the drain electrodes 60 and the source electrodes 62 by etching. The film of metal is formed of Ti/Al/Ti. The semiconductor film 72 is etched at the same time. Then, an insulating layer 74 is formed as a final protection film, contact holes 63 are formed in the insulating layer 74, and an ITO layer is deposited to form pixel electrodes 42.

Figure 18:
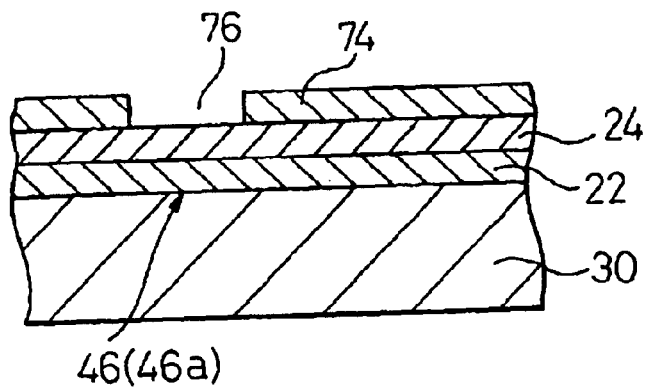
FIG. 18 is a cross-sectional view illustrating the step for perforating a terminal connecting portion at the end of the bus line.
Figure 19:
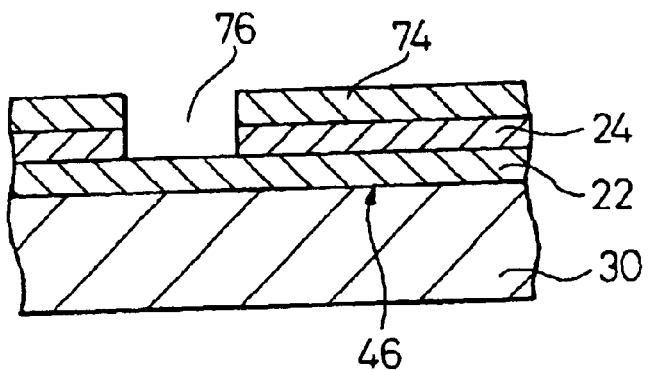
FIG. 19 is a cross-sectional view illustrating the step of ion milling following the step of FIG. 18.

Referring to FIG. 18, contact holes 76 are formed in the insulating layer 74 by etching in order to reveal the gate terminal connecting members (46a) for connecting the gate bus lines 46 to the driving circuit and to reveal the drain terminal connecting members for connecting the drain bus lines 48 to the driving circuit at the periphery of the substrate 30. The gate bus lines 46 include the inner conducting portions 22 and the outer insulating oxide films 24. As for the gate bus lines 46 as shown in FIG. 19, therefore, it is preferable to effect ion milling to perforate the outer insulating oxide films 24 so that the inner conducting portions 22 are revealed.

In the ion milling, argon ions ionized by a source of ions are emitted toward the outer insulating oxide films 24. When the ion milling is not executed, the gate terminal connecting members of the gate bus lines 46 are masked when the anodic oxidation is carried out. However, the ion milling eliminates the steps for forming a mask and for removing the mask. The outer insulating oxide films 24 can be etched with an etching solution such as of chromic acid that has a selectivity for the underlying inner conducting portion 22. However, the waste liquor of chromic acid can be treated only with difficulty.

The process for fabricating the substrate including thin-film transistors is not limited to the one that is described above. For instance, the process may include the steps of covering an insulating substrate with amorphous silicon, crystallizing the amorphous silicon, forming an insulating film, gate bus lines and gate electrodes on said insulating substrate, anodically oxidizing said gate bus lines and said gate electrodes, covering said insulating board with an insulating film and forming contact holes, forming drain electrodes and drain bus lines on said insulating substrate, covering said insulating board with an insulating film and forming necessary contact holes, and forming pixel electrodes composed of a transparent conducting film on said substrate.

Figure 20:
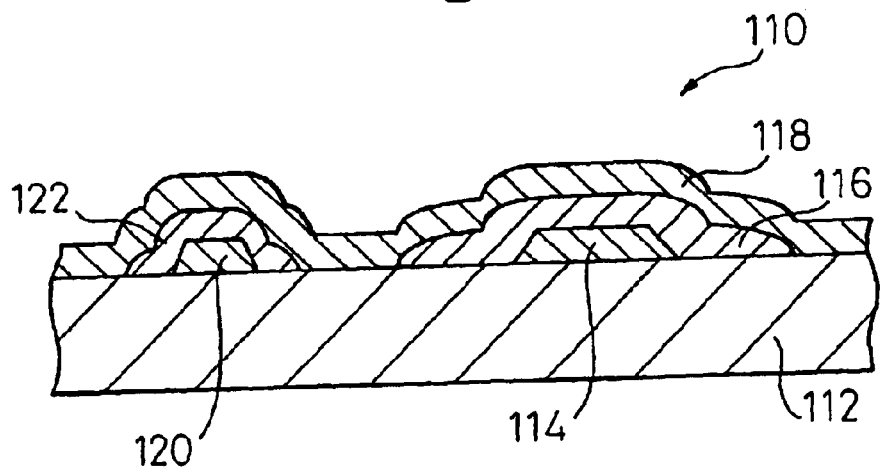
FIG. 20 is a cross-sectional view illustrating an example of the MIM diode.

FIG. 20 illustrates an MIM (metal-insulation-metal) diode 110. The MIM diode 110 is constituted by a metal layer 114, an insulating layer 116 and a metal layer 118 formed on an insulating substrate 112. Furthermore, a bus line 120 and an insulating layer 122 are formed on the insulating substrate 112. The metal layer 114 and the insulating layer 116, and the bus line 120 and the insulating layer 122, are formed of an anodically oxidizable metal such as the conducting layer 12 of FIG. 1, and are etched in the same manner as those shown in FIGS. 2 to 5, and are anodically oxidized as shown in FIG. 6. Another insulating layer may be formed on the insulating layer 116 and on the insulating layer 122.

The above-mentioned embodiment is based on the dip-type etching. However, the above-mentioned embodiment can also be effectively adapted even when the dry-etching based on RIE is used for forming the gate. In this case, the time for dry etching can be shortened. The above-mentioned embodiment is also effective for etching the gates where selectivity relative to the underlying layer is required, the gates being etched within a period of time shorter than the just-etching time.

When it is desired to remove small etching residue that is not electrically connected to the gate bus lines, the washing is effected for about 30 seconds with a dilute HF aqueous solution of a concentration of about 0.2 percent after the gate bus lines have been etched, or the device is dipped in a developing solution, in order to remove the undesired residue without impairing the inclined angle of the side surfaces of the gate bus lines. At present, almost no defect has been discovered in the portions existing independently of the gate bus lines, owing to advanced technology in photoprocessing and deep etching in the transverse direction based upon the taper etching.

FIGS. 21A to 22F illustrate a process for fabricating a thin-film device according to the second embodiment of the present invention. As in the embodiment of FIGS. 1 to 20, the second embodiment, too, produces a substrate including thin-film transistors for a liquid crystal display device.

Figure 22A:
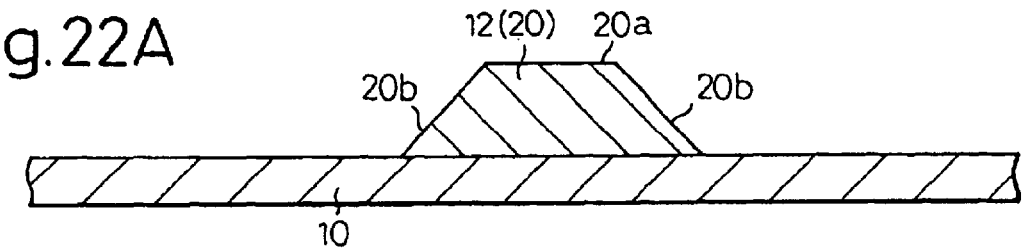
FIGS. 22A to 22F are views illustrating the process for fabricating a thin-film device according to the second embodiment of the present invention.

FIG. 22A illustrates the step in which a conducting layer 12 is formed on a glass substrate 10 and is etched into a predetermined shape. The conducting layer 12 is formed in a manner as shown in FIGS. 1 to 3. As a result of etching, gate bus lines 18 and gate electrodes 20 which are a connection portion are formed from the conducting layer 12, as shown in FIG. 5. FIG. 22A shows a portion of the thus formed gate electrode 20. The gate electrode 20 has an upper surface 20a parallel to the substrate 10 and inclined side surfaces 20b.

In the liquid crystal display device, it is preferable that the wiring material is composed of, for example, aluminum or a metal material containing aluminum as a main component in order to reduce the resistance of the bus lines. It is also allowable to use Ta and W. In the present invention, an anodically oxidizable metal is selected as a metal material for forming gate bus lines 18 and gate electrodes 20. For example, the anodically oxidizable metal includes at least one of Al, Ta, Al—Si, Al—Ta, Al—Zr, Al—Nd, Al—Pd, Al—W, Al—Ti, Al—Ti—B, Al—Sc, Al—Y, Al—Pt and Al—Pa.

Figure 22B:
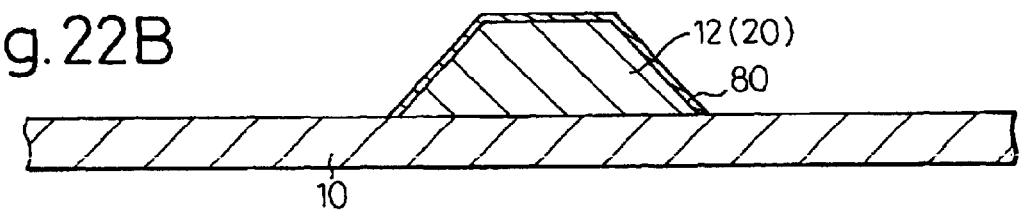

FIG. 22B illustrates the step in which a first oxide film 80 having a predetermined thickness is formed on the conducting layer 12. The first oxide film 80 is spontaneously formed by leaving the conducting layer 12 alone. When the conducting layer 12 is composed of aluminum, the first oxide film 80 becomes an alumina film. The first oxide film 80 is formed by holding the conducting layer 12(20) in a clean room for a predetermined period of time from the end of the etching step until the step of anodic oxidation. Preferably, the holding time is from 24 hours to 120 hours, so that the first oxide film 80 will have a thickness from 50 nm to 100 nm. When the conducting layer 12(20) is left in a humid place or in water, the first oxide film 80 becomes a hydrated film.

Figure 21A:
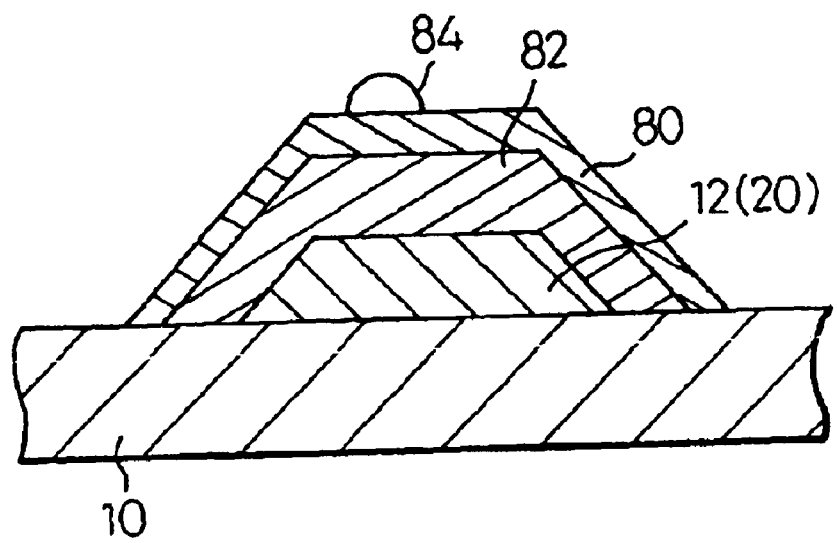
FIGS. 21A and 21B are views illustrating, on an enlarged scale, a part of steps of the process for fabricating a thin-film device according to the second embodiment of the present invention.
Figure 22C:
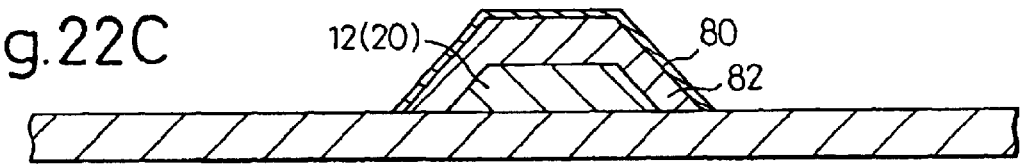

FIG. 22C illustrates the step in which a second oxide film 82 is formed on the conducting layer 12 by anodic oxidation, after the first oxide film 80 having a predetermined thickness is formed on the first conducting layer 12. FIG. 21A also illustrates the step in which the second oxide film 82 is formed on the conducting layer 12. The second oxide film 82 is an anodically oxidized film of a metal which forms the conducting layer 12. When the conducting layer 12 is composed of aluminum, the second oxide film 82 is an alumina film. Though the first oxide film 80 obtained by leaving the conducting film 12 alone is a brittle crystalline alumina film, the second oxide film 82 obtained by the anodic oxidation is an amorphous alumina film. The second oxide film 82 is formed under the first oxide film 80. Accordingly, the first oxide film 80 is located on the surface of the second oxide film 82, and the latter covers the part of the conducting layer 12 that is not oxidized.

Figure 21B:
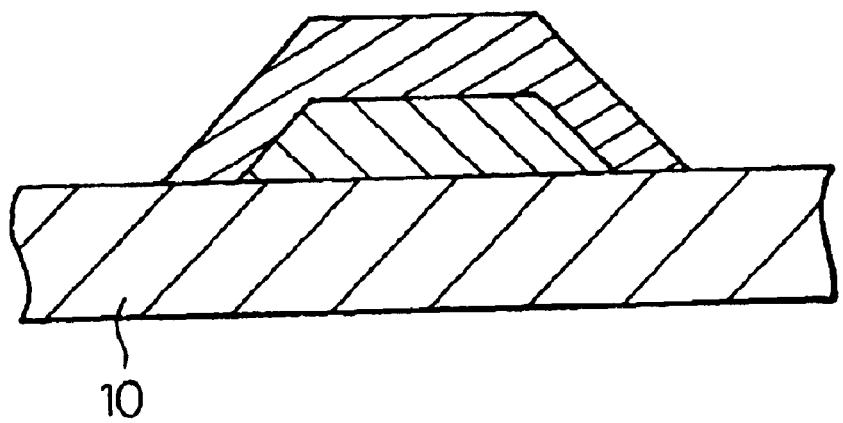
Figure 22D:
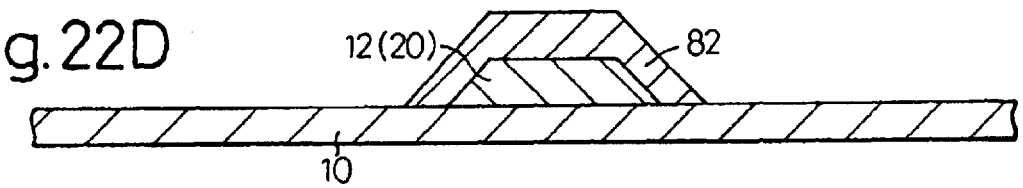

FIGS. 22D and 21B illustrate the steps for washing the substrate 10. Preferably, the washing step is carried out by using ultrasonic waves of not lower than 200 KHz. The first oxide film 80 is a brittle crystalline oxide film and can be easily removed by the washing step with ultrasonic waves such as megasonic waves. The second oxide film 82 is not removed by the washing but remains on the conducting layer 12 to cover the conducting layer 12.

The first oxide film 80 is easily removed in this way, and if particles 84 are initially adhered to the surface of the conducting layer 12 when the latter is formed the particles are removed together with the first oxide film 80 and, besides, organic particles such as resist residue adhering to the initial conducting layer 12 are easily removed together with the first oxide film 80. Accordingly, the surfaces of the conducting layer 12 (gate bus lines 18 and gate electrodes 20) become smooth, preventing the occurrence of bumps on the gate bus lines 18 and preventing the devices provided on the bus lines from being destroyed.

The second oxide film 82 has a high insulating property, but if particles exist on the surface of the second oxide film 82, the devices formed thereon are also structurally destroyed. Therefore, it is necessary to employ a process by which particles are not adhered to the anodically oxidized film. By forming the first oxide film 80 having the thickness within the above-mentioned range, the particles 84 adhering to the initial surface of the conducting layer 12 can be reliably removed together with the first oxide film 80. Furthermore, if the thickness of the first oxide film 80 is too thick, the final designing of the thickness of the conducting layer 12 is disturbed. Thus, the second oxide film 84 remains in a clean state, it is effective in obtaining the structure in which the gate bus lines 18 have a reduced width and an increased thickness like the anodically oxidized film (outer oxide film) 24 in the first embodiment.

Figure 22E:
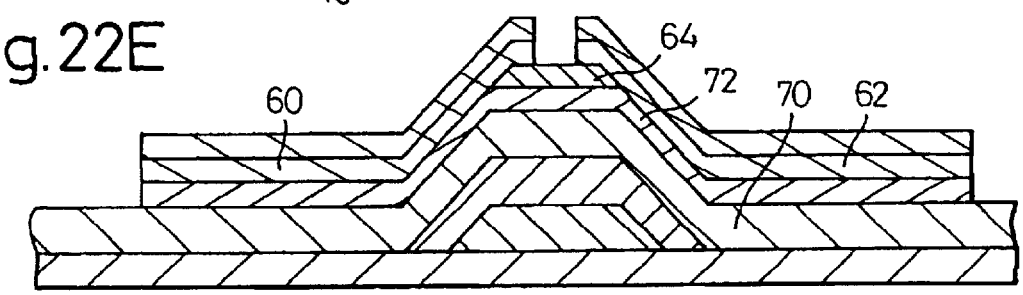
Figure 22F:
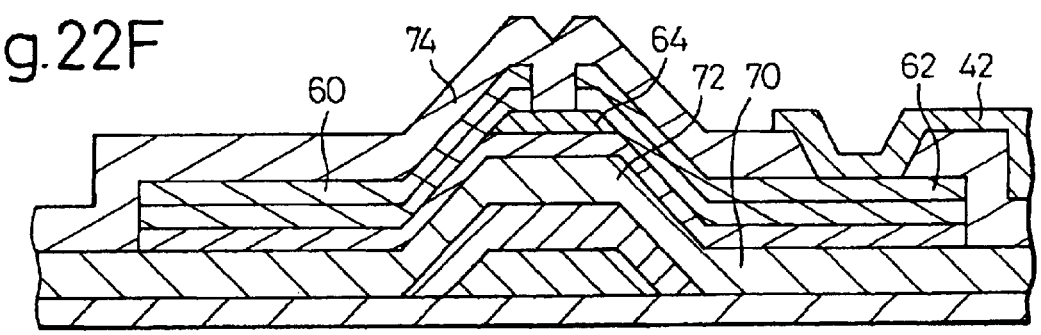

To complete a substrate including thin-film transistors, the steps of FIGS. 22E and 22F (similar to the steps of FIG. 17) are necessary. In FIG. 22E, an insulating layer 70, an amorphous semiconducting layer 72 and a channel protection film 64 are formed on the conducting layer 12 which includes the second oxide film 84. Then, drain electrodes 60, drain bus lines and source electrodes 62 are formed. The drain/source conducting layer has a two-layer structure consisting of an n+a-Si layer and a Ti/Al/Ti layer. The drain/source conducting layer and the semiconductor layer 72 are simultaneously patterned into a predetermined shape.

In FIG. 22F, an insulating layer 74 is formed, holes are formed in the insulating layer 74, and pixel electrodes 42 of ITO are formed.

The feature of this embodiment can be also used for fabricating polycrystalline silicon thin-film transistors (p-SiTFTs), described below. In this case, the process includes the step for forming a semiconductor layer 86 (see FIG. 23) on the substrate 10 and the step for forming an insulating film 88 on the substrate 10, prior to forming the conducting layer 12.

FIGS. 23 to 27 illustrate a thin-film device according to the third embodiment of the present invention.

Figure 23:
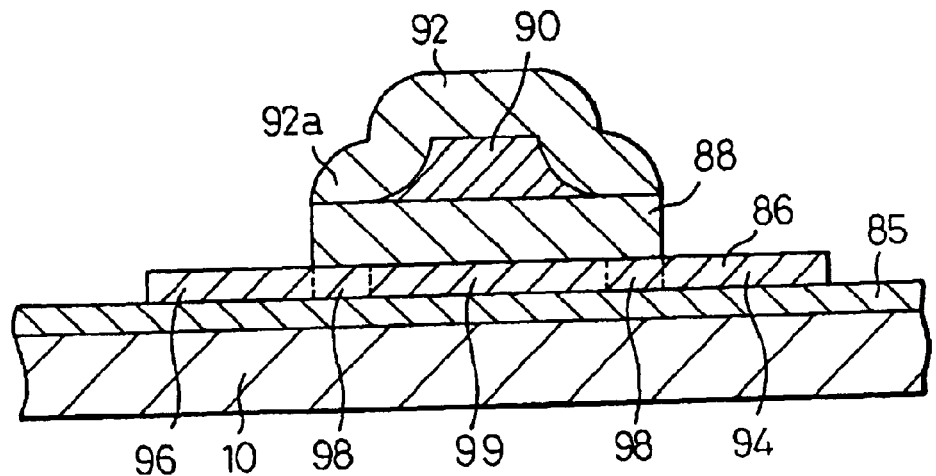
FIG. 23 is a cross-sectional view illustrating a thin-film device produced by the process for fabricating the thin-film device according to the third embodiment of the present invention.

Referring to FIG. 23, the thin-film device according to this embodiment comprises a glass substrate 10, a polycrystalline silicon semiconductor layer 86 formed in a predetermined shape on the substrate 10, an insulating film 88 covering a portion of the semiconductor layer 86, a gate electrode 90 formed on the insulating film 88, and an anodically oxidized film 92 of a gate electrode 90 which is formed on the insulating film 88 to cover the gate electrode 90. The anodically oxidized film 92 has a shape as viewed from above (i.e., as viewed in the plan view) identical to the shape of the insulating film 88 as viewed from above, and has an annular portion 92a which annularly contacts a portion of the insulating film 88 about the gate electrode 90. Portions of the semiconductor layer 86 located on the outer side of the insulating film 88 form a source electrode 94 and a drain electrode 96. A portion of the semiconductor layer 86 covered by the annular portion 92a of the anodically oxidized film 92 inside the insulating film 88 forms offsets 98. A portion of the semiconductor layer 86 inside the offsets 98 forms a channel 99. In this embodiment, the semiconductor layer 86 is formed on an insulating film 85 formed on the glass substrate 10.

FIGS. 27A to 27G illustrate a process for fabricating a thin-film device according to the third embodiment of the present invention.

Figure 27A:
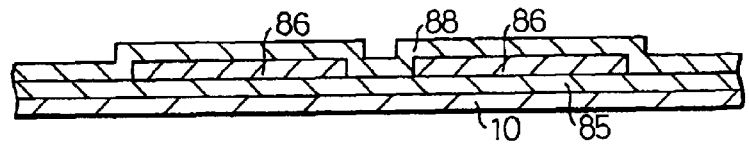
FIGS. 27A to 27G are views illustrating a process for fabricating the thin-film device according to the third embodiment of the present invention.
Figure 27B:
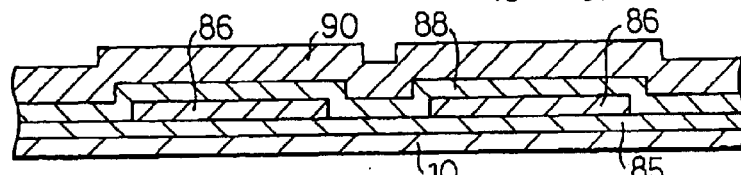

Referring to FIG. 27A, the semiconductor layer 86 is formed in a predetermined shape on the substrate 10 (on the lower insulating layer 85). Then, the insulating film 88 is formed on the substrate 10 to cover the semiconductor layer 86. Then, referring to FIG. 27B, a conducting layer (conducting layer for forming gate electrodes 90 and gate bus lines) composed of an anodically oxidizable metal is formed on the substrate 10 to cover the insulating film 88. An anodically oxidizable metal suited for forming gate bus lines is described above.

Figure 24:
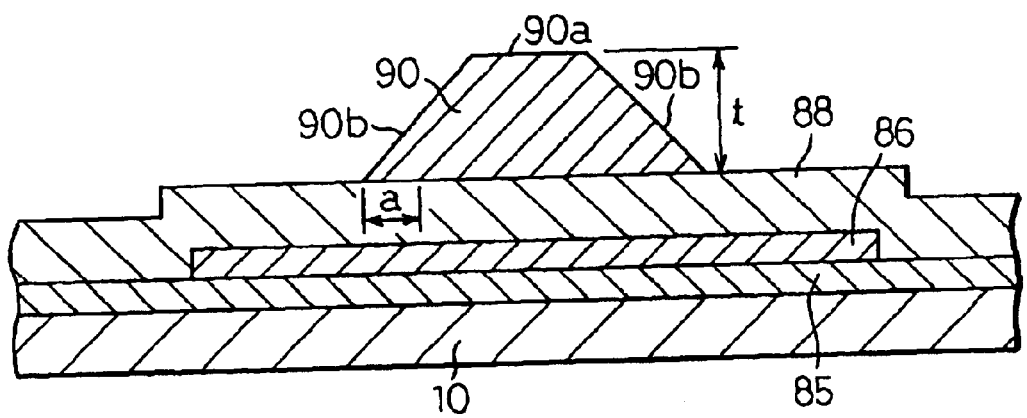
FIG. 24 is a cross-sectional view illustrating, on an enlarged scale, the step for patterning the gate electrode in the process for producing the thin-film device according to the third embodiment of the present invention.
Figure 27C:
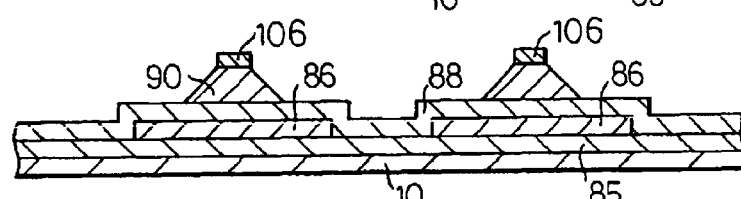

Referring to FIG. 27C and FIG. 24, the conducting layer is patterned into a shape to form gate electrodes 90 (and bus lines) which cover respective portions of the semiconductor layer 86 and have upper surfaces 90a parallel to the substrate 10 and inclined side surfaces 90b. The patterning for forming the gate electrodes 90 is desirably accomplished by ion milling or dry etching.

In forming the gate electrodes 90, a mask resist 106 is formed on the conducting layer and is post-baked at a temperature of not lower than 130° C. but not higher than 200° C. Then, ion milling or dry etching is executed, using the mask resist 106. After the gate electrodes 90 (and bus lines) are patterned, the mask resist 106 is removed.

Figure 25:
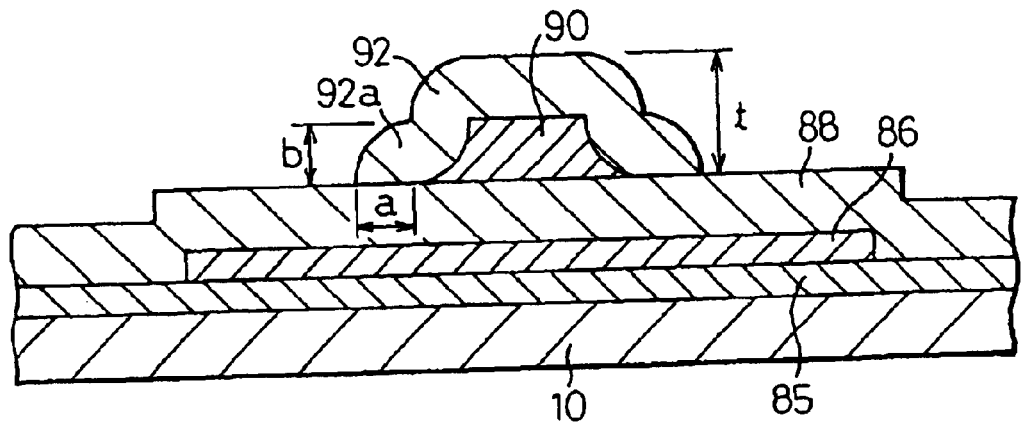
FIG. 25 is a cross-sectional view illustrating, on an enlarged scale, the step for anodic oxidation in the process for fabricating the thin-film device according to the third embodiment of the present invention.
Figure 27D:
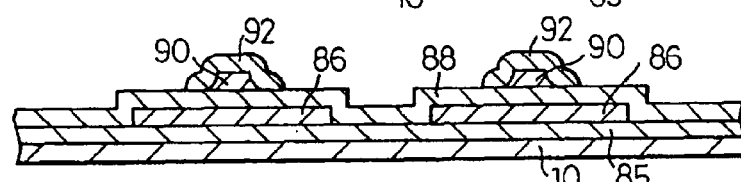

Referring to FIG. 27D and FIG. 25, the gate electrode 90 (and bus line) is anodically oxidized to form anodically oxidized films 92 around the gate electrodes 90. The anodically oxidized films 92 have annular portions 92a that annularly contact portions of the insulating film 88 about the gate electrodes 90.

Figure 27E:
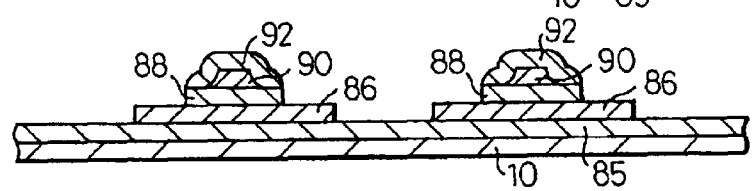

Referring to FIG. 27E, etching is effected using the gate electrodes 90 including the anodically oxidized films 92 as a mask, to form the insulating films 88 in a predetermined shape. Thus, the anodically oxidized film 92 has a shape as viewed from above identical to the shape of the insulating film 88 as viewed from above.

Figure 27F:
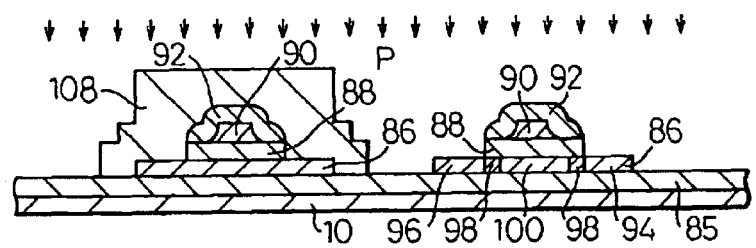
Figure 27G:
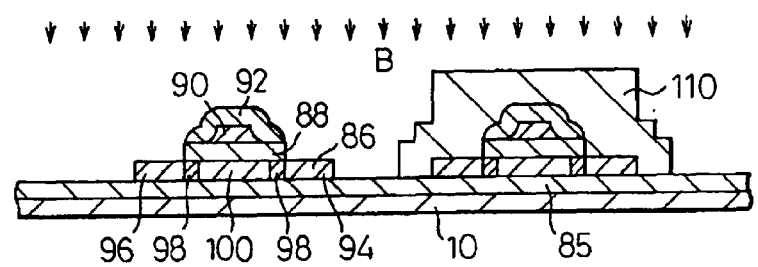

Referring to FIGS. 27F and 27G, ions are injected as impurities into the semiconductor layer 86 using the gate electrode 90 including the anodically oxidized film 92 and the insulating film 88 as a mask. FIG. 27F shows the step in which a mask 108 is formed on a region of the first part of semiconductor layers 86 and P ions are injected into the second part of semiconductor layers 86 to form an n-channel, and FIG. 27G shows the step in which a mask 110 is formed on a region of the second part of semiconductor layers 86 having the n-channel, and B ions are injected into the first part of semiconductor layers 86 where the mask 108 had been formed in order to form a p-channel. It is not necessary to effect both steps of FIGS. 27F and 27G, but one of them can be effected. In this case, the masks 108 and 110 are not required.

In the thin-film transistors using polycrystalline silicon as a semiconductor layer, and in the case where the thin-film device is used as one of the substrates of a liquid crystal display device, the thin-film transistors can be used not only as switching elements for respective pixels but also as transistors of peripheral circuits such as driving circuits to drive the switching elements for realizing displays in the respective pixels, these transistors being provided in the common substrate. In this case, it is necessary to provide for p-type transistors and n-type transistors as the above described transistors, and the steps shown in FIGS. 27F and 27G are required. That is, the steps shown in FIGS. 27F and 27G are part of a process for fabricating a liquid crystal display device having a thin-film device including integrally formed peripheral circuits.

When the ions are to be injected into the semiconductor layer 86 as described above, ions are injected in a relatively large amount into the portions of the semiconductor layer 86 located on the outer side of the anodically oxidized film 92 and the insulating film 88, whereby an HDD (heavily doped drain) is obtained to form the source electrode 94 and the drain electrode 96. Ions of a relatively small amount are injected into the portion of the semiconductor layer 86 on the inside of the insulating film 88 and covered by the annular portion 92a of the anodically oxidized film 92 through the anodically oxidized film 92 and the insulating film 88, whereby an LDD (lightly doped drain) is obtained to form an offset 98. No ions are injected into the portion of the semiconductor layer 86 where the gate electrode 90 exists. It is thus made possible to fabricate a substrate having polycrystalline silicon thin-film transistors including the offset 98 formed by the LDD structure. The anodically oxidized film 92 is a barrier film and works as a channel protection film. That is, according to the present invention, the doping with ions is effected by utilizing the channel protection film in order to form the offset 98.

Figure 26A:
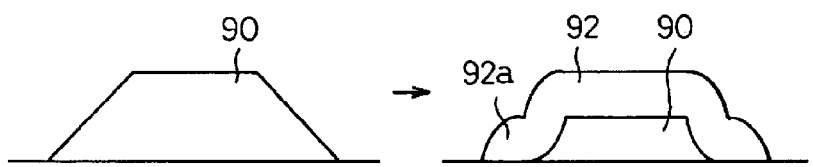
FIGS. 26A to 26D are views illustrating the relationship between the shape of the gate electrode and the anodically oxidized film.
Figure 26B:
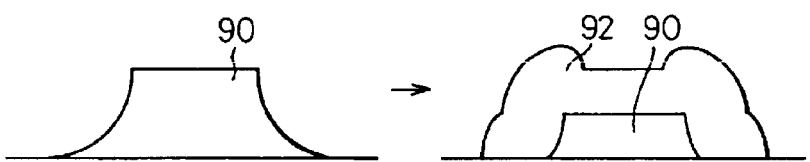
Figure 26C:
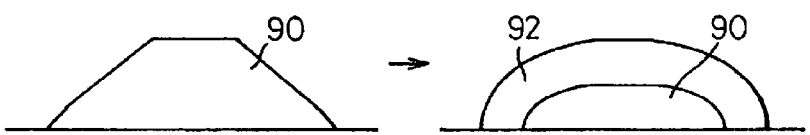

FIGS. 26A to 26C schematically illustrate the relationship between the shape of the electrode 90 which is processed into a predetermined shape and the shape of the anodically oxidized film 92 formed by anodic oxidation. FIG. 26A the gate electrode 90 formed by ion milling or dry etching in which the gate electrode 90 of nearly a trapezoidal shape is obtained. When this gate electrode 90 is anodically oxidized, the annular portion 92a of the anodically oxidized film 92 is relatively thick and uniformly inclined. Thus, the TFT having preferred characteristics equipped with the offset 98 is obtained by the doping with ions by using the anodically oxidized film 92 as a mask.

The gate electrode 90 of nearly a trapezoidal shape shown in FIG. 26A can also be formed by isotropic wet etching. However, isotropic wet etching involves a difficult to control operation (see FIG. 8), and makes it difficult to obtain the gate electrode 90 of nearly the trapezoidal shape that is shown in FIG. 26A. In many cases, the isotropic wet etching forms the gate electrode 90 having upwardly convex or concave inclined surfaces, as shown in FIGS. 26B and 26C. During the anodic oxidation, a current of an increased density flows at the edge portion. When the shape of the gate electrode 90 changes, the width of the annular portion 92a of the anodically oxidized film 92 changes, and the length of the LDD varies, making it difficult to form a predetermined offset 98. The length of the LDD severely affects the TFT characteristics. Therefore, the wet etching which is difficult to control is not suited for this case (particularly where it is desired to ensure a uniform property in the plane on a large glass substrate).

Figure 26D:
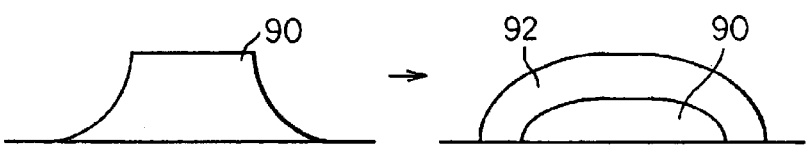

FIG. 26D shows the case where the isotropic wet etching is effected and the anodic oxidation is effected at a low current density (including a soft-start method). In this case, the anodically oxidized film 92 has a smooth shape but the surface is greatly undulated.

In FIGS. 24 and 25, by appropriately controlling the tapered angle of the side surface of the gate electrode 90, the thickness of the anodically oxidized film 92, and conditions of the etching and the anodic oxidation, it possible to sufficiently increase the thickness of a portion where the LDD is to be formed. Upon suitably determining the conditions for ion doping, then, the LDD portion doped with less ions can be formed in a tapered manner without increasing the thickness of the gate insulating film 88.

Preferably, after the gate electrode 90 is patterned into a predetermined shape, the resist is post-baked at about 200° C., and the gate electrode 90 is processed to provide inclination by RIE (reactive ion etching) or ion milling. After the gate electrode 90 is processed to provide an inclination, the resist mask is removed by ashing with $O_2$, followed by washing with ultrasonic waves to a slight degree; i.e., the resist mask is removed without any residue left. Despite residue remaining on the gate electrode to a slight degree, the first oxide film 80 is formed at a suitable thickness prior to the anodic oxidation and is washed after the anodic oxidation as described with reference to FIGS. 21A to 22F, so that the residue is removed together with the first oxide film 80 (this processing can be conveniently carried out if the resist has been post-baked at a high temperature).

Here, the metal material of the gate electrode 90 withstands the post-baking temperature of 200° C. (and does not develop bumps), is not easily corroded with an alkali developing solution, exhibits nearly the same sheet resistance as pure aluminum, does not leave residue after the etching, and can be anodically oxidized. A preferred metal material for forming the gate electrode 90 is an Al—Sc alloy thin-film.

In particular, it is preferable that the inclination processing of the gate electrode 90 is carried out by ion milling, which does not cause aluminum to be corroded after the processing. In this case, selectivity to the underlying $SiO_2$ (insulating film 88) plays an important role, so it is desired to use an end-point detector for the ion milling process.

As an example, furthermore, the aluminum gate bus line is formed to a thickness of 400 nm, the LDD is formed to a length of 500 nm, the wiring is formed to a width of 3 $\mu$m, and the gate bus line and the gate electrode 90 are so processed as to form an inclining angle of about 21 degrees, and, then, the anodically oxidized film is formed on the aluminum wiring at a formation voltage of 140 V and a current density of about 2.5 mA/cm². More practically, however, the inclination angle may be about 30 degrees.

This is because the anodically oxidized region of the edge portion becomes broader than the calculated region (the effective current density at the edge portion becomes higher, see, for example, FIG. 26B). This effect increases with an increase in the current density during the initial period of anodic oxidation. However, when the current density is too high during the anodic oxidation, the wiring is heated by the formation treatment unless the anodically oxidizing solution (forming solution) is cooled, the current tends to be overshoot during the initial period, or vigorous current spike phenomenon takes place during the constant-voltage mode, resulting in the occurrence of local dissolution of aluminum (particularly, at portions where foreign matter adheres during the sputtering and at weak points where a step occurs in the gate wiring) or developing of aluminum bumps during the anodic oxidation.

It is therefore desired that the initial current density at the time of anodic oxidation is not smaller than 2.0 mA/cm² but is not larger than 3.0 mA/cm². Here, the word "initial" is used. This is because the above-mentioned shape is not obtained and the gate surface is greatly undulated when the slow-starting method (in which the current is gradually increased up to a target formation current in order to suppress the initial overshooting of current) is employed to effect the anodic oxidation by using a cheaply constructed power source (in order to suppress the cost of the apparatus). It is desired to use the power source having a circuit capable of preventing the initial overshooting without relying upon the slow starting.

In simultaneously forming the LDD and the HDD, therefore, the portion where the LDD is to be formed is formed by utilizing the gate insulating film plus anodically oxidized film, creating a large difference in the amount of doping between the LDD and the HDD, and maintaining a process margin in the ion-doping process. Besides, the gate wiring that is inclined does not cause a defect (such as step-cutting of drain bus lines) in the device formed on the upper portion.

According to the present invention as described above, it is possible to fabricate a very dense panel at a high yield while satisfying requirements for preventing defects such as breakage of the bus lines during the processing of the gates and for preventing defects caused by defective gate etching. Besides, the time for etching the gates is shortened, and the tact time is improved.

In addition, fewer particles adhere to the substrate after the anodic oxidation, and fewer defects occur in the structure of the device. Accompanying the improved TFT characteristics, furthermore, the opening degree of the aperture of the pixels can be enhanced, the LDD can be formed by the electrode protection film (anodically oxidized film), performance of the liquid crystal display device can be enhanced, the steps can be simplified, and the yield can be improved.

What is claimed is:

1. A process for fabricating a thin-film device, said process comprising:
   forming a conducting layer composed of an anodically oxidizable metal on a substrate;
   etching said conducting layer to form a plurality of bus lines having upper surfaces parallel to said substrate and inclined sides surfaces and connection portions electrically connected to said bus lines and having upper surfaces parallel to said substrate and inclined surfaces, each of the side surfaces of said bus lines and the side surfaces of said connection portion are outwardly protruding with respect to a line passing through upper and lower edges of one of the side surfaces; wherein said etching step is carried out so that portions of the side surfaces of said bus lines and the side surfaces of said connection portions are inclined at angles within the range from 20 degrees to 60 degrees with respect to a line parallel to the substrate surface on average;
   anodically oxidizing said bus lines and said connection portions so that said bus lines and said connection portions include inner conducting portions and outer insulating oxide films covering said inner conducting portions, respectively.

2. A process according to claim 1, wherein said etching is carried out so that the side surfaces of said bus lines and the side surfaces of said connection portions are inclined at angles within the range from 30 degrees to 50 degrees, on average, with respect to said substrate.

3. A process according to claim 1, further comprising forming a mask on said conducting layer prior to said etching, and ashing said substrate including said mask between said mask forming and said etching.

4. A process according to claim 1, further comprising forming a mask on said conducting layer and baking said mask prior to said etching, wherein the temperature for baking said mask is so set that said mask will have a relatively small rigidity so that an outer portion of said mask is pushed up from said conducting layer due to a reaction gas in said etching.

5. A process according to claim 4, wherein the temperature for baking said mask is not higher than 115° C.

6. A process according to claim 4, wherein said etching step is carried out so that the angles between the upper surfaces and the side surfaces of said bus lines and of said connection portions are obtuse angles.

7. A process according to claim 1, further comprising an ionic milling step for removing part of the outer oxide films to expose the inner conducting portions after said step of anodic oxidation.

8. A process for fabricating a thin-film device, said process comprising:
   forming a conducting layer composed of an anodically oxidizable metal on a substrate;
   etching said conducting layer in a predetermined shape;
   forming a second oxide film on said conducting layer by anodic oxidation after a first oxide film with a thickness is formed on said conducting layer; and
   washing said substrate, whereby said first oxide film is removed by said washing and said second oxide film is not removed by said washing but remains on said conducting layer so as to cover said conducting layer.

9. A process according to claim 8, wherein said anodically oxidizable metal includes at least one of Al, Ta, Al—Si, Al—Ta, Al—Zr, Al—Nd, Al—Pd, Al—W, Al—Ti, Al—Ti—B, AlSc, Al—Y, Al—Pt, and Al—Pa.

10. A process according to claim 8, wherein said first oxide film is one of a naturally oxidized film or a hydrated film formed on the surface of said anodically oxidizable metal.

11. A process according to claim 8, wherein said first oxide film has a thickness from 50 nm to 100 nm.

12. A process according to claim 8, wherein said washing is executed using ultrasonic waves of not lower than 200 KHz.

13. A process according to claim 8, wherein said thin-film device is a substrate including thin-film transistors.

14. A process according to claim 13, further comprising forming an insulating film on said substrate and forming a semiconductor layer on said substrate after the second oxide film has been formed, wherein the etching of said conducting layer forms gate electrodes and gate wirings.

15. A process according to claim 13, further comprising forming a semiconductor layer on said substrate and forming an insulating film on said substrate prior to forming said conducting layer, wherein the etching of said conducting layer forms gate electrodes and gate wirings.

16. A process according to claim 8, wherein the etching of said conducting layer forms gate electrodes having upper surfaces parallel to said substrate and inclined side surfaces.

17. A process for fabricating a thin-film device, said process comprising:
   forming a semiconductor layer having a predetermined shape on a substrate; forming an insulating film on said substrate to cover said semiconductor layer;
   forming a conducting layer composed of an anodically oxidizable metal on said substrate in such a shape as to cover a portion of said semiconductor layer and to form gate electrodes having upper surfaces parallel to said substrate and inclined side surfaces;

anodically oxidizing said gate electrodes;

forming said insulating film into a predetermined shape using said gate electrodes including the anodically oxidized film as a mask; and injecting impurities into said semiconductor layer using said gate electrodes including said anodically oxidized film and said insulating film as a mask to form an offset in said semiconductor layer.

18. A process according to claim 17, wherein said thin-film device is a substrate including thin-film transistors.

19. A process according to claim 17, wherein said anodically oxidizable metal includes at least one of Al, Ta, Al—Si, Al—Ta, Al—Zr, Al—Nd, Al—Pd, Al—W, Al—Ti, Al—Ti—B, AlSc, Al—Y, Al—Pt, and Al—Pa.

20. A process according to claim 17, wherein said anodically oxidized film is a barrier-type anodically oxidized film.

21. A process according to claim 17, wherein said semiconductor layer comprises a polycrystalline silicon.

22. A process according to claim 17, wherein an initial current density at the time of executing the anodic oxidation is not smaller than 2.0 mA/cm2 but is not larger than 3.0 mA/cm2.

23. A process according to claim 17, wherein forming said gate electrodes comprises forming a gate electrode layer and patterning the gate electrode layer based on either ionic milling or dry-etching.

24. A process according to claim 17, wherein a masking resist is formed on said conducting layer and is post-basked at a temperature of not lower than 130° C., prior to forming said gate electrode.

* * * * *